United States Patent
Lin

(10) Patent No.: US 7,262,644 B2
(45) Date of Patent: Aug. 28, 2007

(54) METHOD AND APPARATUS FOR SWITCHING FREQUENCY OF A SYSTEM CLOCK

(75) Inventor: Yen-Yu Lin, Hsin-Chu Hsien (TW)

(73) Assignee: Mediatek Inc., Hsin-Chu Hsien (TW)

( * ) Notice: Subject to any disclaimer, the term of this patent is extended or adjusted under 35 U.S.C. 154(b) by 22 days.

(21) Appl. No.: 11/163,676

(22) Filed: Oct. 26, 2005

(65) Prior Publication Data
US 2006/0091918 A1 May 4, 2006

(30) Foreign Application Priority Data
Oct. 29, 2004 (TW) .................. 93133112 A
May 13, 2005 (TW) .................. 94115609 A

(51) Int. Cl.
*H03B 19/00* (2006.01)
(52) U.S. Cl. ............... 327/113; 327/115; 327/117
(58) Field of Classification Search .............. None
See application file for complete search history.

(56) References Cited

U.S. PATENT DOCUMENTS

| | | | | |
|---|---|---|---|---|
| 5,495,452 A | * | 2/1996 | Cha | 365/222 |
| 5,499,280 A | * | 3/1996 | Wilson et al. | 377/108 |
| 6,040,828 A | * | 3/2000 | Park | 345/213 |
| 6,049,236 A | * | 4/2000 | Walden | 327/99 |
| 6,160,566 A | * | 12/2000 | Maeda | 347/234 |
| 2003/0090302 A1 | | 5/2003 | Hanamori | 327/113 |
| 2004/0100310 A1 | * | 5/2004 | Kurakane | 327/114 |

* cited by examiner

Primary Examiner—Cassandra Cox
(74) Attorney, Agent, or Firm—Winston Hsu

(57) ABSTRACT

A system clock switching apparatus, which includes a clock source for providing a reference clock signal; a frequency divider electrically connected to the clock source for dividing the reference clock signal to produce a frequency-divided signal and a system clock signal; and an enable signal generator electrically connected to the frequency divider for dividing the frequency-divided signal to produce at least one enable signal. The frequency divider switches the frequency of the system clock signal at a time period corresponding to a pulse edge of the frequency-divided signal.

57 Claims, 17 Drawing Sheets

METHOD AND APPARATUS FOR SWITCHING FREQUENCY OF A SYSTEM CLOCK

BACKGROUND

The disclosure relates to frequency switching techniques for a system clock signal, and more particularly, to system clock switching apparatuses and related methods that avoid drift of enable signals corresponding to the system clock signal while switching the frequency of the system clock signal.

In a synchronous circuit, each individual module or component synchronously operates according to a system clock signal. The synchronous circuit may change or switch the frequency of the system clock signal to meet different operational requirements. For example, power consumption can be reduced by lowering the frequency of the system clock signal. In the related art, a phase-locked loop (PLL) or a digital frequency divider is typically employed to change or switch the frequency of the system clock signal.

In addition to the system clock signal, the synchronous circuit further utilizes one or more enable signals with fixed frequency to maintain the system functionalities. For example, a GSM communication system requires an enable signal QBIT_EN for determining the timing of signal transmission and reception. If the enable signal drifts, the communication quality and performance of the GSM system is seriously deteriorated.

As mentioned previously, the PLL is widely employed to switch frequencies of system clock signals in the related art. As is well known in the art, when the PLL switches the frequency of an output clock signal, a settling time is required for the frequency of the output clock signal to reach a stable status again. During the settling time, the enable signal often drifts since the frequency of the output clock signal generated from the PLL is not stable.

Please refer to FIG. 1, which shows a block diagram of a conventional system clock generating device 100. The system clock generating device 100 utilizes a PLL 110 to generate a clock signal PCLK as a system clock signal SCLK of a system circuit 130. As mentioned above, the PLL 100 requires a settling time for the frequency of the clock signal PCLK to reach a stable status again while changing the frequency of the clock signal PCLK. To avoid the operations of the system circuit 130 from being negatively affected by the unstable frequency of the clock signal PCLK within the settling time, the multiplexer 120 bypasses the clock signal PCLK from the PLL 110 and instead selects an external clock signal XCLK with a fixed frequency to be the system clock signal SCLK. When the PLL 110 reaches a new stable status, the multiplexer 120 switches the system clock signal SCLK from the external clock signal XCLK to the clock signal PCLK generated by the PLL 110.

Hereinafter, a conventional method of switching the system clock signal SCLK is described by employing the operations of switching the frequency of the clock signal PCLK from 52 MHz to 26 MHz made by the PLL 110 as an example.

First, the multiplexer 120 bypasses the clock signal PCLK (52 MHz) from the PLL 110 and switches the system clock signal SCLK to the external clock signal XCLK. Next, the PLL 110 adjusts the frequency of the clock signal PCLK to 26 MHz. After the PLL 110 reaches a stable status, the multiplexer 120 switches the system clock signal SCLK from the external clock signal XCLK to the clock signal PCLK (26 MHz) from the PLL 110.

However, the multiplexer 120 switches the system clock signal SCLK from the clock signal PCLK to the external clock signal XCLK or from the external clock signal XCLK to the clock signal PCLK is an asynchronous clock switching operation. Thus, the clock signal PCLK from the PLL 110 and the external clock signal XCLK may be different in phase or frequency during the switching operation. As a result, it is difficult to maintain the period of the enable signal constantly while switching the frequency of the system clock signal SCLK and thereby causing the enable signal to drift.

As mentioned above, the digital frequency divider can be employed to generate the system clock signal of different frequency in the related art. However, employment of the digital frequency divider may also cause the enable signal to drift. In general, the enable signal is generated from a counter. Please refer to the example illustrated in FIG. 2, which depicts a block diagram of a conventional system clock generating device 200 while applying a digital frequency divider to change a frequency of the system clock signal. A digital frequency divider 210 of the system clock generating device 200 divides a reference clock signal RCLK which has a fixed frequency for generating a system clock signal SCLK. A counter 220 then generates an enable signal according to the system clock signal SCLK. Take the enable signal QBIT_EN that has a frequency of 13/12 MHz for example. When the frequency of the system clock signal SCLK generated from the digital frequency divider 210 is 52 MHz, the counter 220 generates an enable signal QBIT_EN every forty-eight system clock periods. When the frequency of the system clock signal SCLK is 13 MHz, the counter 220 generates an enable signal QBIT_EN every twelve system clock periods. However, the digital frequency divider 210 may switch the frequency of the system clock signal SCLK at any time, and frequency switch therefore may change the period of the enable signal QBIT_EN generated by the counter 220.

Please refer to FIG. 3 and FIG. 4. FIG. 3 shows a timing diagram of the enable signal QBIT_EN with a lengthened period. As shown in FIG. 3, the system clock signal SCLK is lengthened when the digital frequency divider 210 switches the frequency of the system clock signal SCLK from 52 MHz to 13 MHz. As detailed in the aforementioned descriptions, when the frequency of the system clock signal SCLK is 52 MHz, the counter 220 generates an enable signal QBIT_EN every forty-eight system clock periods, i.e., once the counter 220 counts from forty-seven to zero (the count value QBIT_CNT from forty-seven to zero), an enable signal QBIT_EN is generated. If the digital frequency divider 210 does not switch the frequency of the system clock signal SCLK, the count value sequence of the counter 220 should be equal to QBIT_CNT(expected) and the counter 220 should generate the enable signal when the count value QBIT_CNT(expected) is zero, such as the QBIT_EN(expected) shown in FIG. 3. However, because the frequency of the system clock signal SCLK is switched from 52 MHz to 13 MHz, the system clock period is lengthened and the counting period of the counter 220 is extended. Therefore, the actual count value sequence from the counter 220 is QBIT_CNT. As a result, the time at which the enable signal QBIT_EN occurs is delayed and the period of the enable signal is lengthened, thereby causing the enable signal to drift.

As shown in FIG. 4, the system clock signal SCLK is shortened when the frequency of the system clock signal SCLK is switched from 13 MHz to 52 MHz. As detailed in the aforementioned descriptions, when the frequency of the system clock signal SCLK is 13 MHz, the counter 220 generates an enable signal QBIT_EN every twelve system clock periods, i.e., once the counter 220 counts from eleven to zero (the count value QBIT_CNT from eleven to zero), an enable signal QBIT_EN is generated. If the digital frequency divider 210 does not switch the frequency of the system clock signal SCLK, the counter 220 should generate the enable signal when the count value QBIT_CNT(expected) is zero, such as the QBIT_EN(expected) shown in FIG. 4. However, because the frequency of the system clock signal SCLK is switched from 13 MHz to 52 MHz, the system clock period is shortened and the counting period of the counter 220 is thereby shortened.

As a result, the time at which the enable signal QBIT_EN occurs is advanced and the period of the enable signal is shortened, thereby causing the enable signal to drift.

SUMMARY OF THE INVENTION

It is therefore an objective to provide system clock switching apparatuses capable of avoiding the enable signal from drifting while switching the frequency of system clock signal.

An exemplary embodiment of a system clock switching apparatus at least includes a clock source, a frequency divider, and an enable signal generator. The clock source provides a reference clock signal. The frequency divider is electrically connected to the clock source for dividing the reference clock signal to produce a frequency-divided signal and a system clock signal. The enable signal generator is electrically connected to the frequency divider for dividing the frequency-divided signal to produce at least one enable signal. The frequency divider switches frequency of the system clock signal during a time period corresponding to a pulse edge of the frequency-divided signal.

Another exemplary embodiment of a system clock switching apparatus at least includes a clock source, an enable signal generator, and a frequency divider. The clock source provides a reference clock signal. The enable signal generator is electrically connected to the clock source for generating at least one enable signal. The frequency divider is electrically connected to the clock source for dividing the reference clock signal to generate a system clock signal, and for switching the frequency of the system clock signal during a time period corresponding to a pulse edge of the enable signal.

An exemplary embodiment of a method for switching frequency of a system clock signal at least includes the following steps. Provide a reference clock signal. Divide the reference clock signal to produce a frequency-divided signal. Generate a system clock signal according to the reference clock signal. Divide the frequency-divided signal to produce at least one enable signal. Switch frequency of the system clock signal during a time period corresponding to a pulse edge of the frequency-divided signal.

Another exemplary embodiment of a method for switching frequency of a system clock signal at least includes followings steps. Provide a reference clock signal. Generate at least one enable signal. Divide the reference clock signal to produce a system clock signal. Switch frequency of the system clock signal during a time period corresponding to a pulse edge of the enable signal.

These and other objectives will no doubt become obvious to those of ordinary skill in the art after reading the following detailed description of the preferred embodiment that is illustrated in the various figures and drawings.

DETAILED DESCRIPTION

Figure 1:
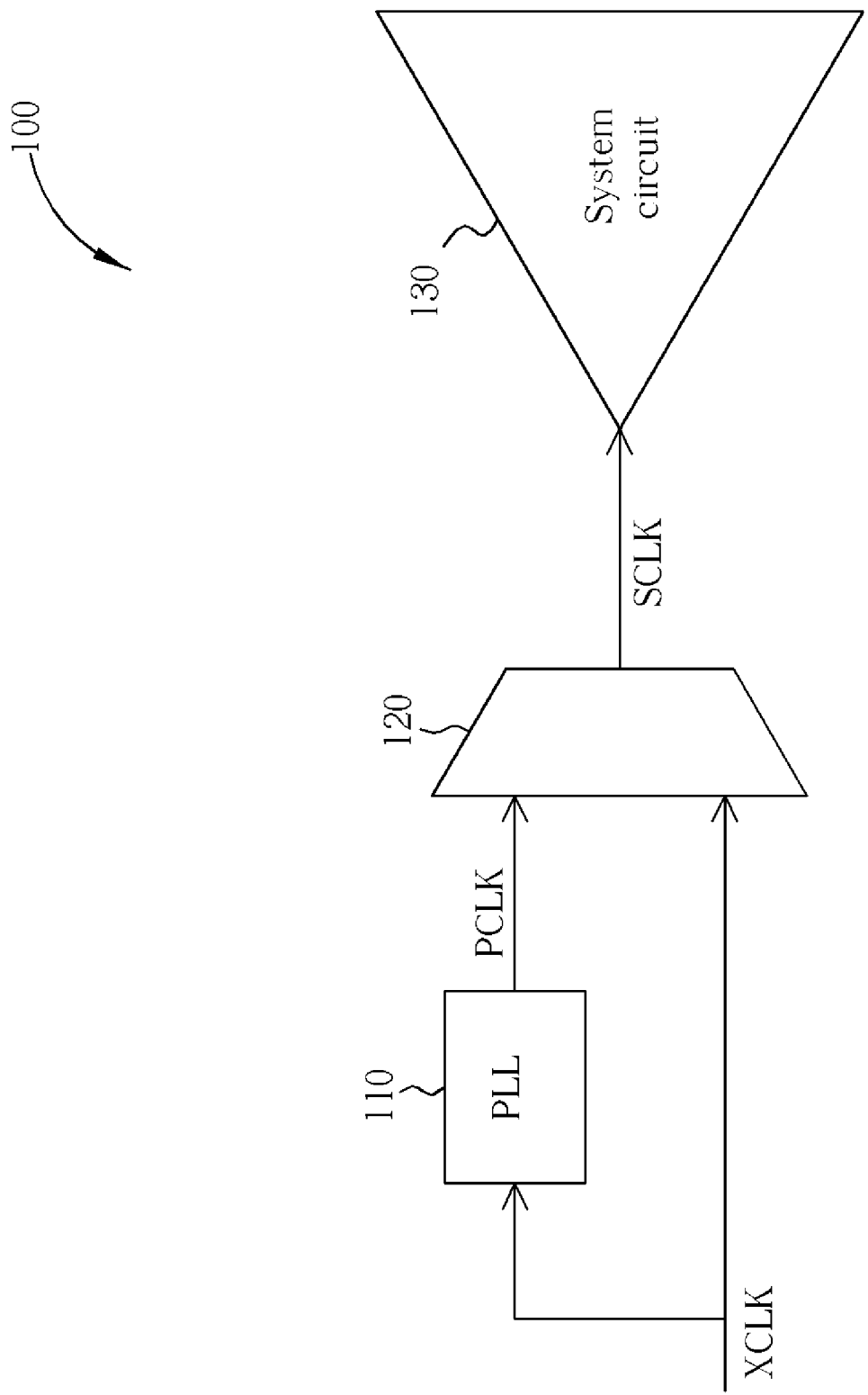
FIG. 1 is a block diagram of a conventional system clock generating device adopting a PLL to change frequency of the system clock signal.
Figure 2:
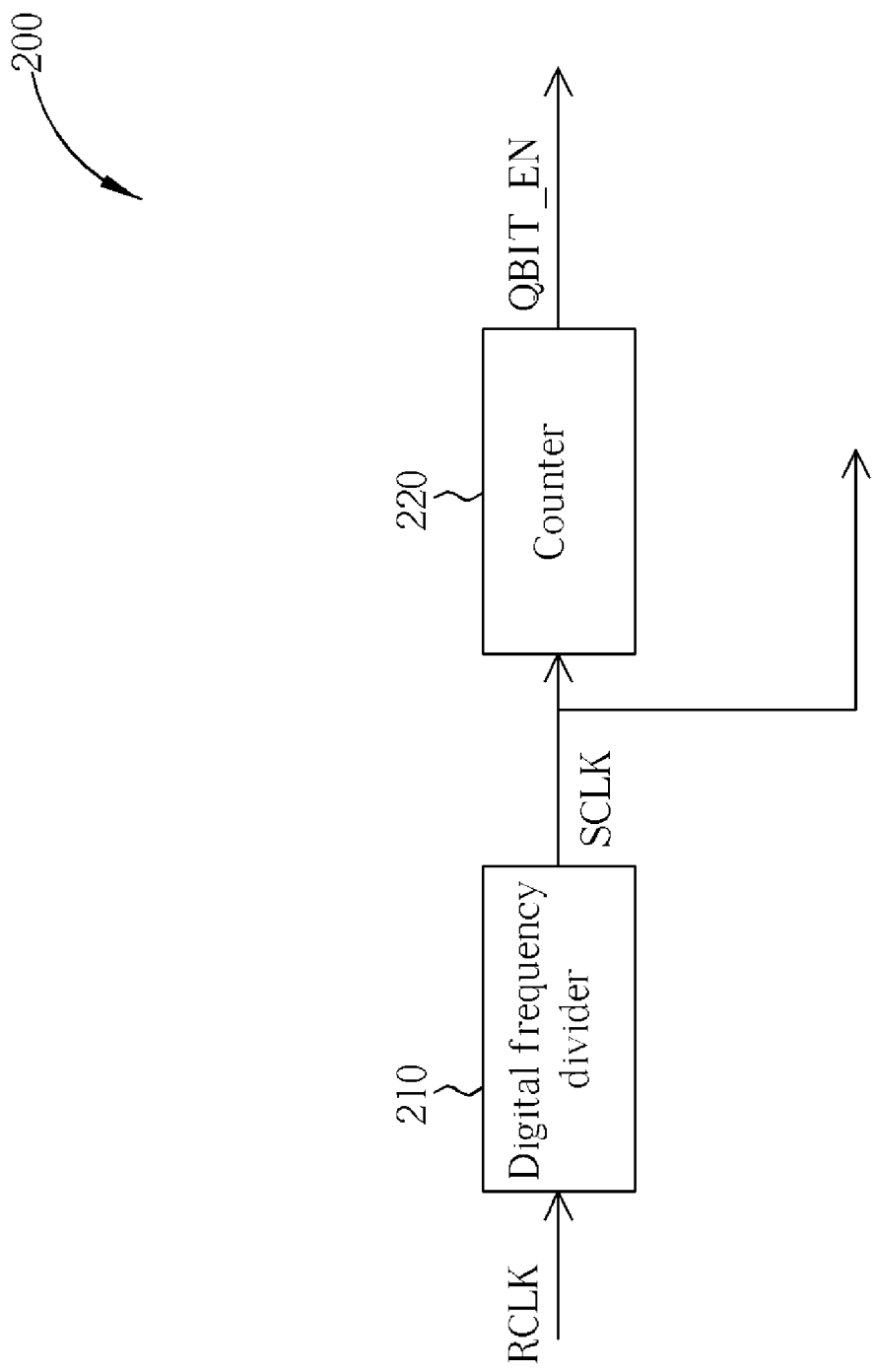
FIG. 2 is a block diagram of a conventional system clock generating device applying a digital frequency divider to change frequency of the system clock signal.
Figure 3:
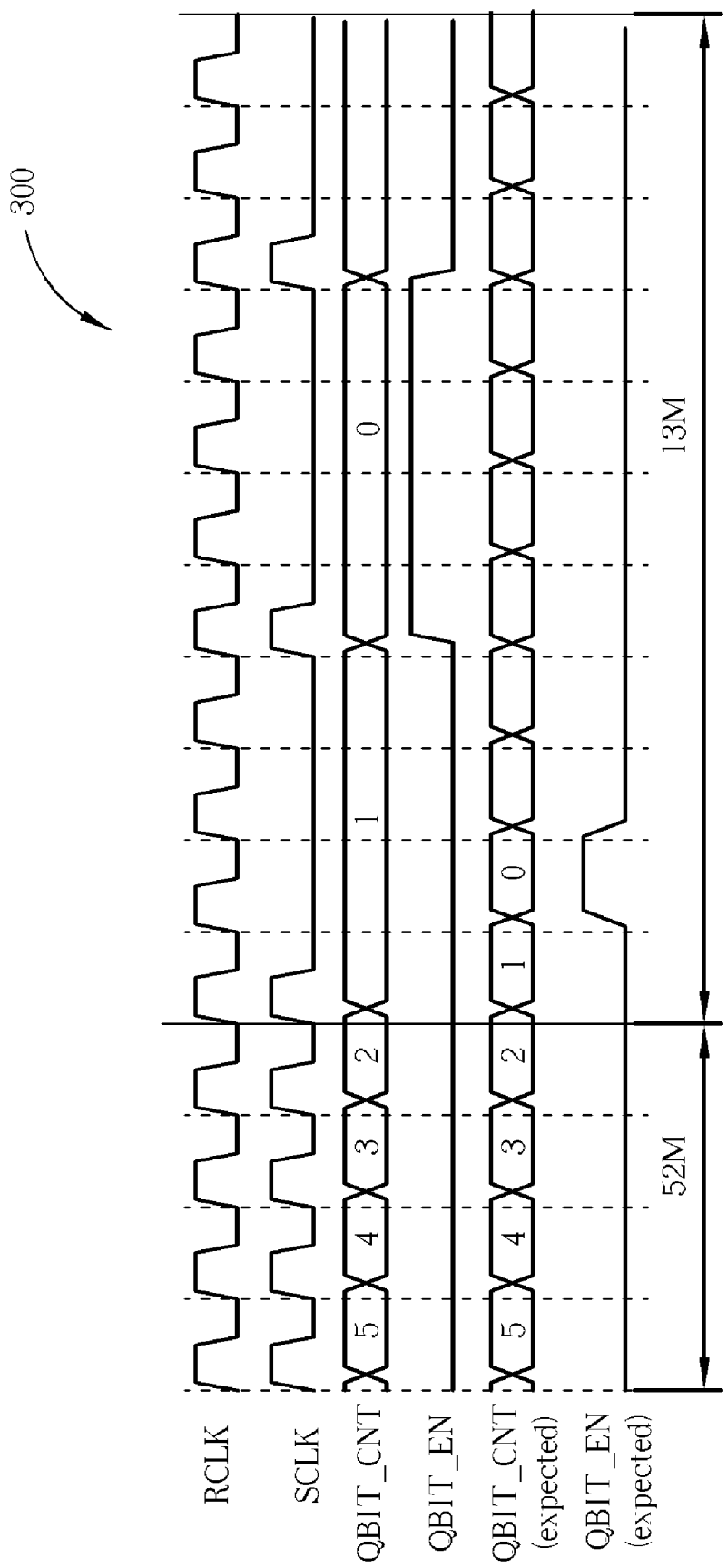
FIG. 3 is a timing diagram of the enable signal with a lengthened period.
Figure 4:
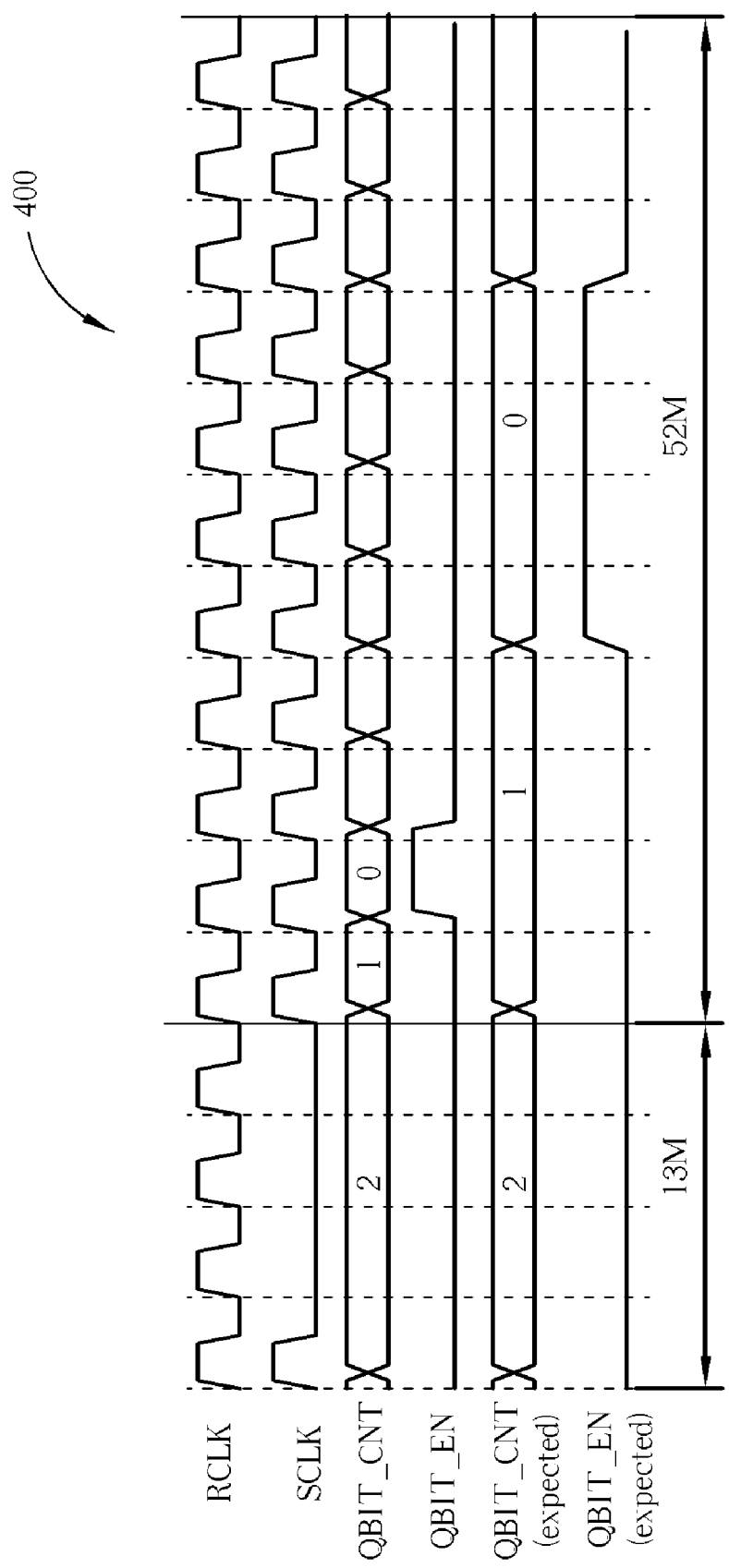
FIG. 4 is a timing diagram of the enable signal with a shortened period.
Figure 5:
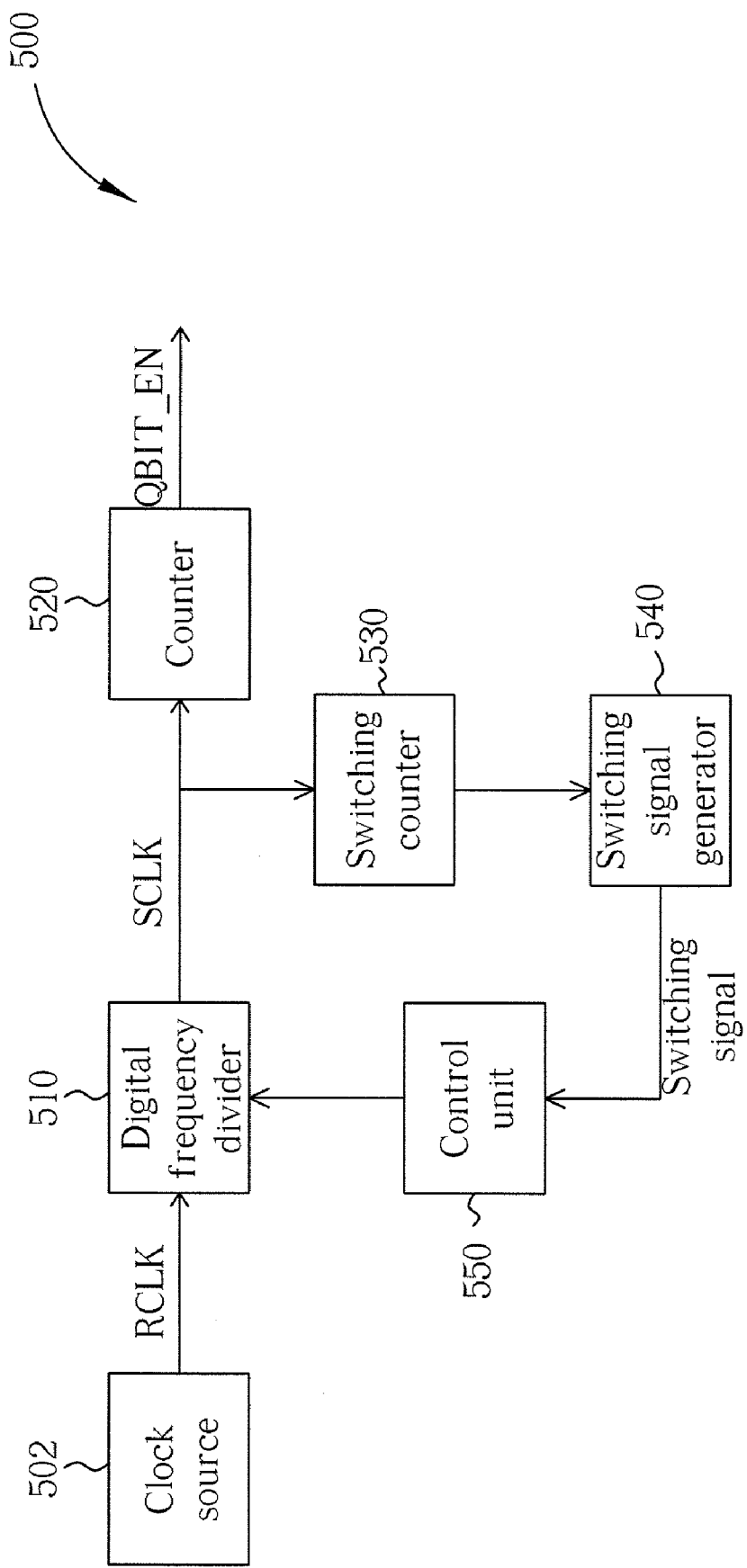
FIG. 5 is a block diagram of a system clock switching apparatus according to a first embodiment.

Please refer to FIG. 5, which shows a block diagram of a system clock switching apparatus 500 according to a first embodiment. The system clock switching apparatus 500 comprises a clock source 502 for providing a reference clock signal RCLK; a switching signal generator 540 for generating a switching signal; a switching counter 530 coupled to the switching signal generator 540 for counting from a predetermined number to zero; and a control unit 550 coupled to the switching signal generator 540 for controlling a digital frequency divider 510 to switch the frequency of a system clock signal SCLK. When the switching counter 530 counts from the predetermined number to zero, the switching signal generator 540 generates a corresponding switching signal. The switching signal generator 540 then applies the switching signal to the control unit 550. If the system clock switching apparatus 500 is required to switch the frequency of the system clock signal SCLK, the control unit 550 allows the frequency switching operation only when the switching signal occurs. In other words, the control unit 550 allows the digital frequency divider 510 to switch the frequency switching of the system clock signal SCLK only when the switching signal from the switching signal generator 540 is received.

Suppose that the digital frequency divider 510 can switch the frequency of the system clock signal SCLK to 52 MHZ, 26 MHz, or 13 MHz. As mentioned previously, the enable signal QBIT_EN has a frequency of 13/12 MHz. When the frequency of the system clock signal SCLK is 52 MHz, a counter 520 generates an enable signal QBIT_EN every forty-eight system clock periods. When the frequency of the system clock signal SCLK is 26 MHz, a counter 520 generates an enable signal QBIT_EN every twenty-four system clock periods. When the frequency of the system clock signal SCLK is 13 MHz, a counter 520 generates an enable signal QBIT_EN every twelve system clock periods. To ensure that the frequency of the system clock signal SCLK is switched when the count value QBIT_CNT of the counter 520 reaches zero (i.e., a timing or a pulse edge when the enable signal QBIT_EN occurs), the predetermined number of the switching counter 530 can be configured to forty-seven. In other words, the switching signal generator 540 generates a switching signal every forty-eight system clock periods. The number forty-eight is a common multiple of forty-eight, twenty-four, and twelve, so an enable signal QBIT_EN is generated once a switching signal has occurred.

In other words, the system clock switching apparatus 500 switches the frequency of the system clock signal SCLK at a time point that the enable signal QBIT_EN is generated, i.e., at a pulse edge of the enable signal QBIT_EN, to avoid the enable signal QBIT_EN from drifting. The digital frequency divider 510 switches the frequency of the system clock signal SCLK only when the switching signal is present. At that time, the count value QBIT_CNT of the counter 520 also reaches zero. Accordingly, it is guaranteed that the frequency of the system clock signal SCLK is switched at the time that the counter 520 generates the enable signal QBIT_EN. As a result, the period of the enable signal QBIT_EN generated by the counter 520 is not lengthened or shortened, i.e., the enable signal QBIT_EN does not drift.

Figure 6:
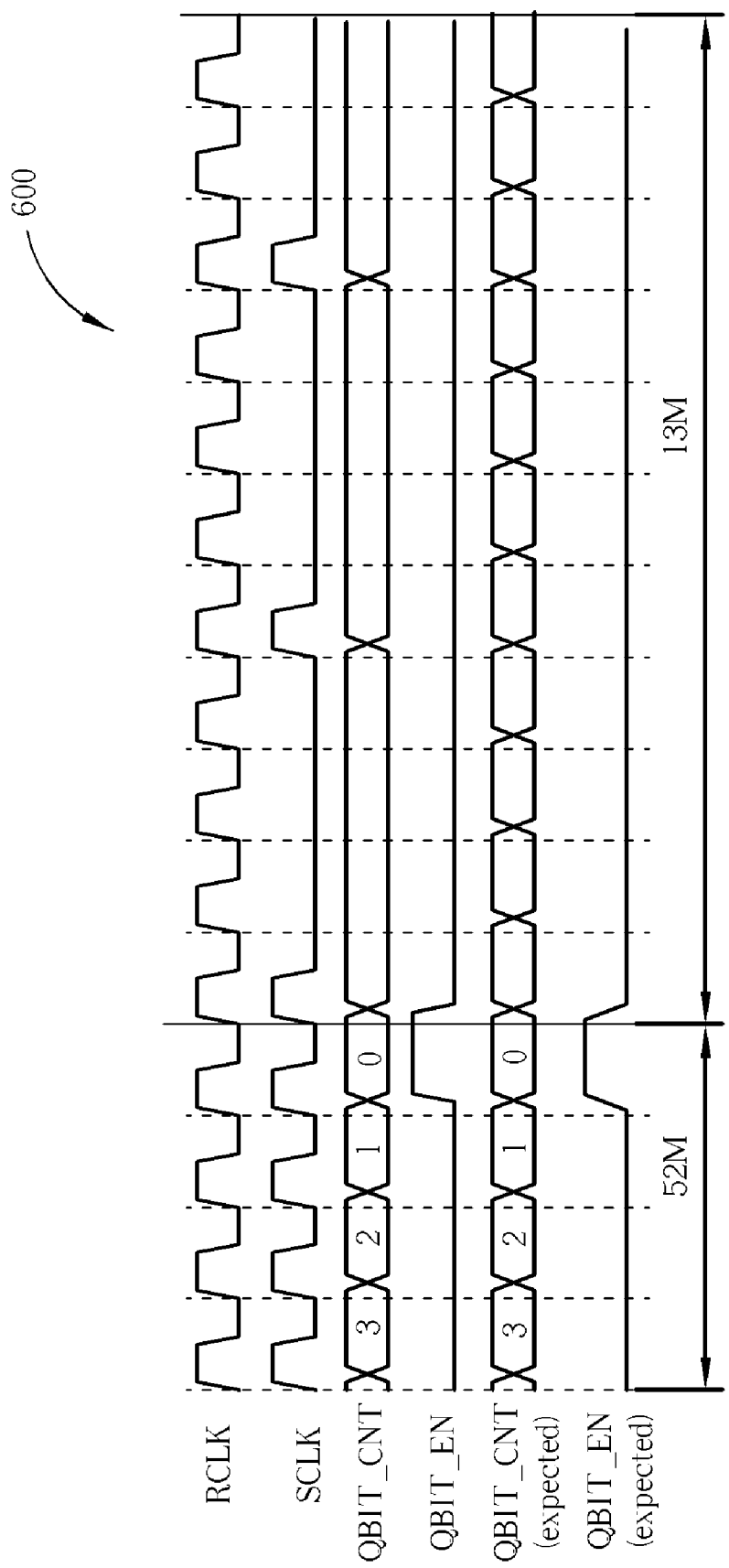
FIG. 6 is a timing diagram of the system clock switching apparatus of FIG. 5.

FIG. 6 is a timing diagram 600 of the system clock switching apparatus 500. As shown in FIG. 6, the frequency of the system clock signal SCLK is switched when the count value QBIT_CNT of the counter 520 reaches zero. Therefore, the enable signal QBIT_EN is generated at the same time as the ideal enable signal QBIT_EN (expected) without an advance or a delay in the time, i.e., the enable signal QBIT_EN does not drift.

If the system clock switching apparatus 500 is designed to generate a plurality of enable signals, the predetermined number of the switching counter 530 may be set to a value corresponding to the common multiple of the pulse periods of the plurality of enable signals. In another embodiment, for example, the system clock switching apparatus not only utilizes the counter 520 to generate the aforementioned enable signal QBIT_EN having a frequency of 13/12 MHz, but also utilizes another counter (not shown) to generate another enable signal X_EN having a frequency of 13/5 MHz. In this embodiment, when the frequency of the system clock signal SCLK is 13 MHz, the counter 520 generates an enable signal QBIT_EN every twelve system clock periods and another counter generates an enable signal X_EN every five system clock periods. Therefore, the predetermined number of the switching counter 530 can be set to fifty-nine so that the switching signal generator 540 generates a switching signal every sixty system clock periods. Since sixty is the common multiple of five and twelve, both an enable signal QBIT_EN and an enable signal X_EN are generated when a switching signal is generated.

In this embodiment, the digital frequency divider 510 correspondingly adjusts the predetermined number of the switching counter 530 during switches in the frequency of the system clock signal SCLK. For example, the predetermined number of the switching counter 530 can be adjusted to one hundred and nineteen when the frequency of the system clock signal SCLK is switched to 26 MHz. The predetermined number can be adjusted to two hundred and thirty nine when the frequency of the system clock signal SCLK is switched to 52 MHz and so on. As a result, the time that the digital frequency divider 510 switches the frequency of the system clock signal SCLK corresponds to a common edge of the plurality of enable signals so that no enable signals drift while switching the frequency of the system clock signal SCLK.

Figure 7:
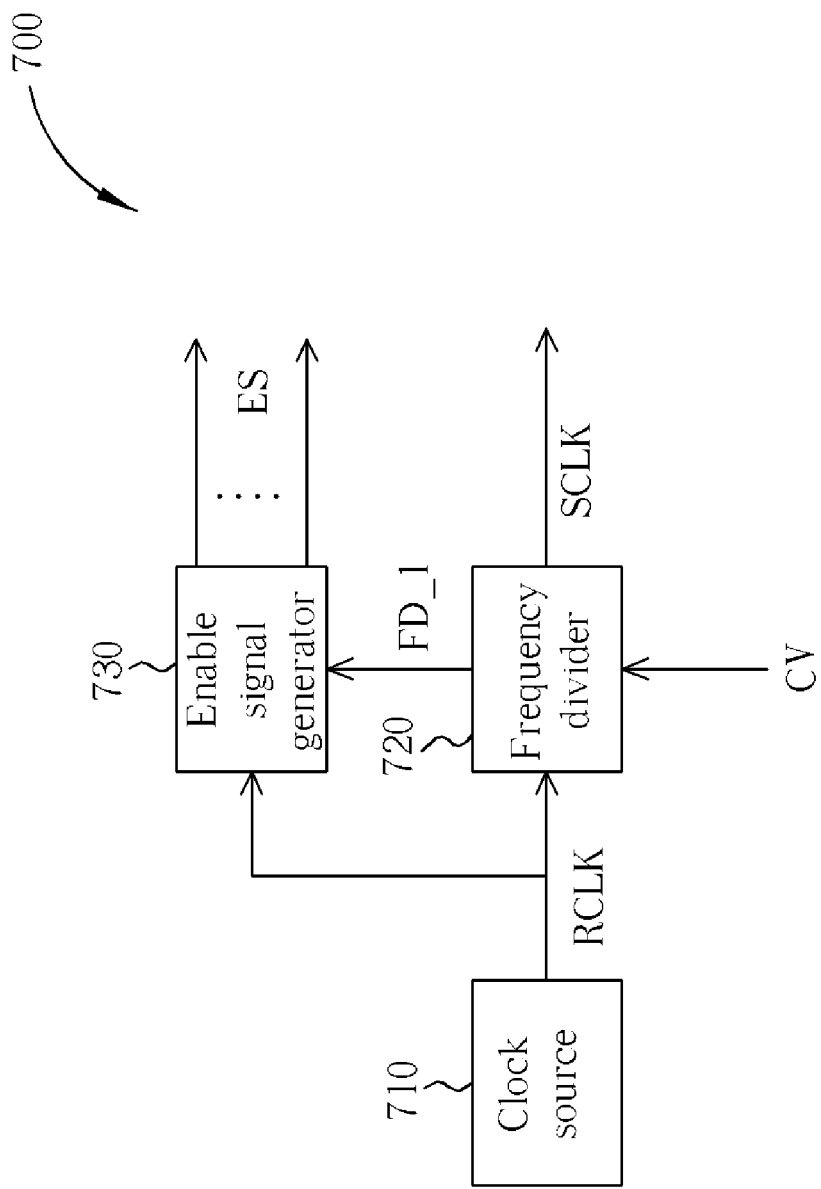
FIG. 7 is a system clock switching apparatus according to a second embodiment.

Please refer to FIG. 7, which shows a system clock switching apparatus 700 according to a second embodiment. The system clock switching apparatus 700 comprises a clock source 710, a frequency divider 720 coupled to the clock source 710, and an enable signal generator 730 coupled to the frequency divider 720. The clock source 710 is arranged for providing a reference clock signal RCLK. In practice, the clock source 710 may be, but is certainly not limited to, a phase-locked loop (PLL). In this embodiment, the reference clock signal RCLK output from the clock source 710 has a fixed frequency. In addition, as shown in FIG. 7, the reference clock signal RCLK is employed as the working clock of the enable signal generator 730. In the following paragraphs, the operations of the frequency divider 720 and the enable signal generator 730 will be described in greater detail.

The frequency divider 720 divides the frequency of the reference clock signal RCLK to generate a frequency-divided signal FD_1 having a constant relationship to the reference clock signal RCLK. Specifically, the frequency of the reference clock signal RCLK is an integer multiple of the frequency of the frequency-divided signal FD_1. Since the frequency of the reference clock signal RCLK is fixed, the frequency of the frequency-divided signal FD_1 is fixed accordingly. In addition to the frequency-divided signal FD_1, the frequency divider 720 further performs a frequency-dividing operation on the reference clock signal RCLK to generate a system clock signal SCLK according to a control value CV, which is a digital control value corresponding to a target frequency. Due to the system clock signal SCLK being generated by dividing the reference clock signal RCLK, it can be appreciated that the frequency of the reference clock signal RCLK is an integer multiple of the frequency of the system clock signal SCLK. Accordingly, the frequency of the system clock signal SCLK generated from the frequency divider 720 is an integer multiple of the frequency of the frequency-divided signal FD_1. In contrast to the frequency-divided signal FD_1, the frequency of the system clock signal SCLK (or the ratio of the frequency of the system clock signal SCLK to the frequency of the reference clock signal RCLK) is determined by the control value CV and is not a constant value. Note that since both the system clock signal SCLK and the frequency-divided signal FD_1 are generated by dividing the reference clock signal RCLK, the frequency-divided signal FD_1 is edge-aligned to the system clock signal SCLK.

The enable signal generator 730 divides the frequency-divided signal FD_1 that is output from the frequency divider 720 to generate at least one enable signal ES. Since each enable signal ES is generated by dividing the frequency-divided signal FD_1, it can be derived that each enable signal ES is edge-aligned to the system clock signal SCLK. In practice, the enable signal generator 730 may be implemented with one or more counters.

In this embodiment, the frequency divider 720 is designed to switch the frequency of the system clock signal SCLK during a time period corresponding to a pulse edge of the frequency-divided signal FD_1, i.e., the time period corresponds to a pulse boundary of the frequency-divided signal FD_1. As in the foregoing descriptions, since the frequency-divided signal FD_1 has a constant frequency relationship to the reference clock signal RCLK, switching the frequency of the system clock signal SCLK does not affect the frequency of the frequency-divided signal FD_1. In other words, when the frequency divider 720 changes or switches the frequency of the system clock signal SCLK, the frequency and period of each enable signal ES generated by the enable signal generator 730 is not influenced. Additionally, since the time at which the frequency of the system clock signal SCLK is switched corresponds to a pulse edge or pulse boundary of the frequency-divided signal FD_1, each enable signal ES generated is based on the frequency-divided signal FD_1 and is edge-aligned to the frequency-changed system clock signal SCLK. By this way, it is guaranteed that each enable signal ES does not drift while switching the frequency of the system clock signal SCLK.

Figure 8:
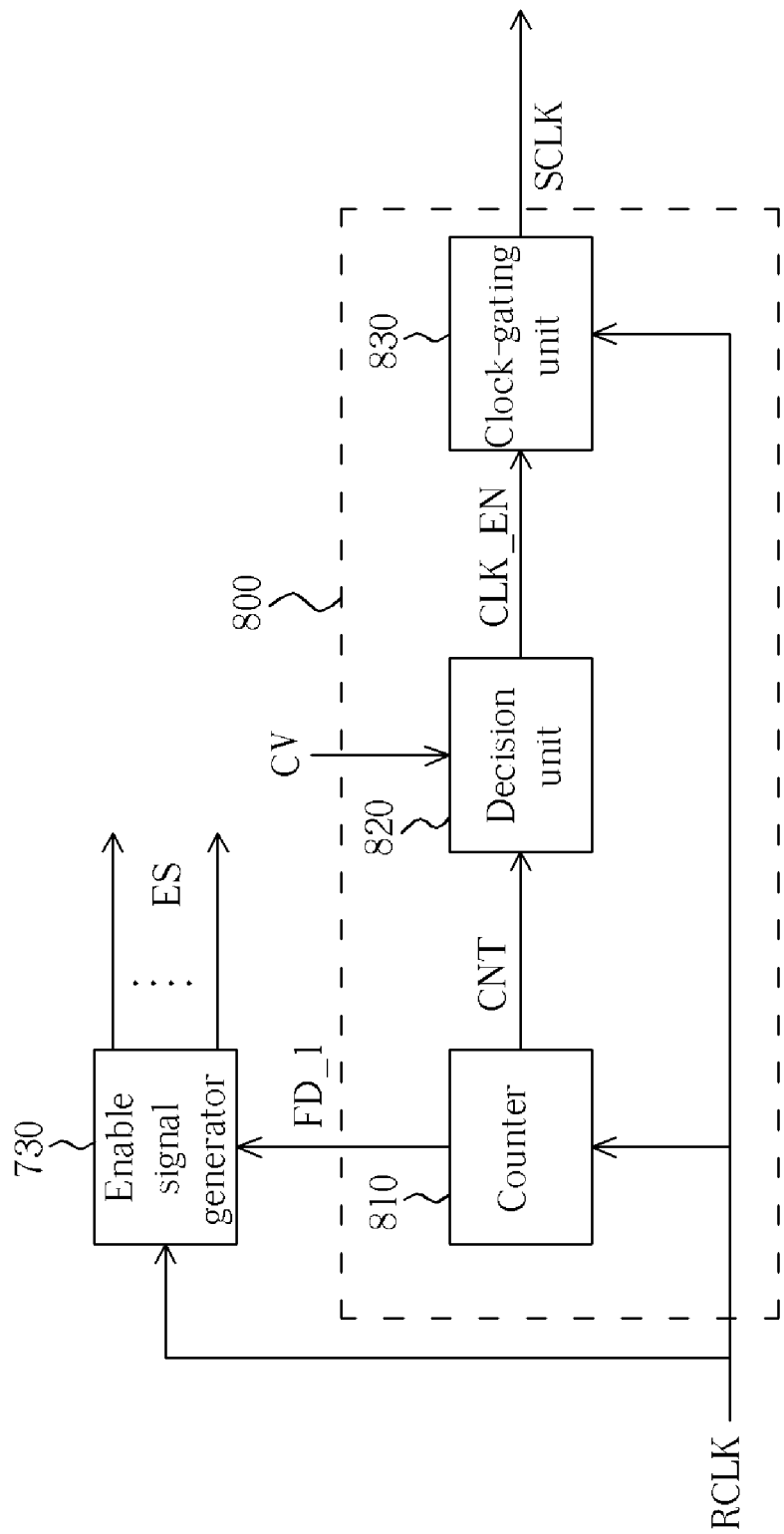
FIG. 8 is a block diagram of the frequency divider of FIG. 7 according to a first embodiment.
Figure 9:
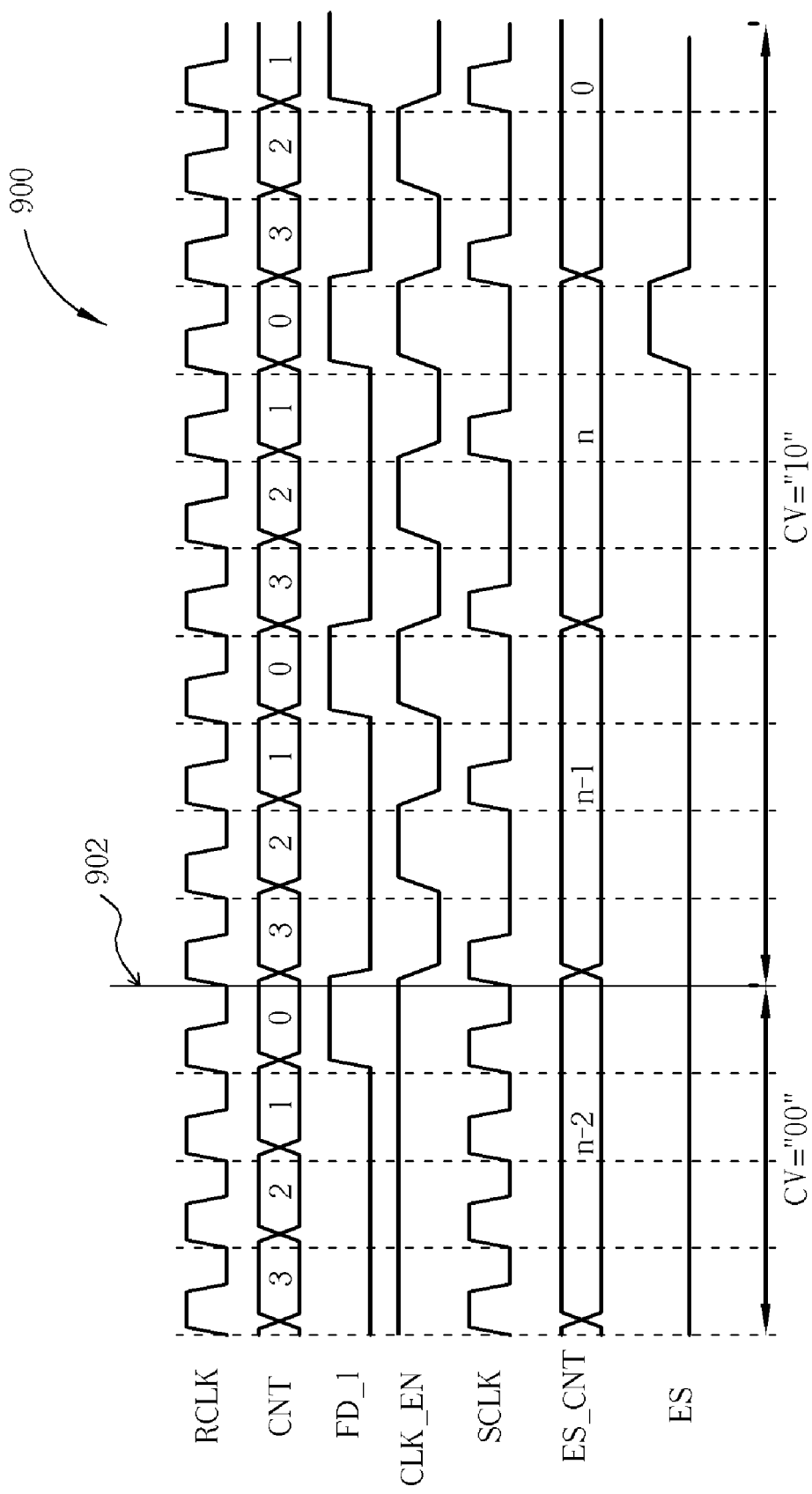
FIG. 9 through FIG. 12 are different timing diagrams of the frequency divider of FIG. 8.

Please refer to FIG. 8 and FIG. 9. FIG. 8 shows a block diagram of a frequency divider 800, which is a first embodiment of the frequency divider 720. FIG. 9 shows a timing diagram 900 of the frequency divider 800 to switch the frequency of the system clock signal SCLK according to one embodiment. As shown in FIG. 8, the frequency divider 800 comprises a counter 810 coupled to the clock source 710; a decision unit 820 coupled to the counter 810; and a clock-gating unit 830 coupled to the decision unit 820 and the clock source 710. For the purpose of explanatory convenience in the following description, the frequency of the reference clock signal RCLK provided by the clock source 710 is herein assumed to be 52 MHz, and the frequency of the frequency-divided signal FD_1 generated from the frequency divider 800 is fixed in one-fourth of the frequency of the reference clock signal RCLK. In this embodiment, the counter 810 repeatedly counts from three to zero according to the reference clock signal RCLK and continuously applies the count value CNT to the following decision unit 820. Once the count value CNT is equal to zero, the counter 810 triggers a pulse. Accordingly, the frequency of the frequency-divided signal FD_1 that is output from the counter 810 is fixed at one-fourth of the frequency of the reference clock signal RCLK, i.e., 13 MHz.

In the timing diagram 900, ES denotes one of the plurality of enable signals generated by the enable signal generator 730, and ES_CNT denotes a count value sequence output from a counter (not shown) used for generating the enable signal ES in the enable signal generator 730. The counter counts the pulses of the frequency-divided signal FD_1 to output the count value sequence ES_CNT. In this embodiment, the counter triggers a pulse of the enable signal ES once the count value reaches a number n. For example, if the enable signal ES has a frequency of 13/12 MHZ (e.g., the aforementioned enable signal QBIT_EN), then n can be set to eleven. If the enable signal ES has a frequency of 13/5 MHZ (e.g., the aforementioned enable signal X_EN), then n can be set to four.

On the other hand, the decision unit 820 generates an output signal CLK_EN according to a control value CV and a count value CNT output from the counter 810. In this embodiment, once the count value CNT as applied to the decision unit 820 is equal to zero (i.e., during a pulse edge of the frequency-divided signal FD_1), the control value CV is loaded into the decision unit 820 to determine the operations of the decision unit 820. If a new control value CV is not currently loaded, the decision unit 820 continues its operations based on the previously loaded control value CV. In another aspect, the decision unit 820 switches or changes its operations only when the count value CNT is equal to zero. For the purpose of explanatory convenience to describe the operations of the decision unit 820, the control value CV is herein assumed to have four valid values: 00, 01, 10, and 11 corresponding to the frequency settings of 52 MHz, 39 MHz, 26 MHz, and 13 MHz, respectively. In the timing diagram 900, the original control value CV loaded into the decision unit 820 is "00" corresponding to the frequency setting of 52 MHz. At a time point 902, a new control value "10" corresponding to the frequency setting of 26 MHz is loaded into the decision unit 820.

In this embodiment, if the control value CV being loaded into the decision unit 820 is "00" such as that before the time point 902 of the timing diagram 900, the decision unit 820 always sets the output signal CLK_EN to a first logic level, such as logic 1 in this embodiment, regardless of the received count value of CNT being zero, one, two, or three. If the control value CV being loaded into the decision unit 820 is "10" such that after the time point 902 of the timing diagram 900, the decision unit 820 sets the output signal CLK_EN to logic 1 when the received count value CNT is 0 or 2, and sets the output signal CLK_EN to logic 0 when the received count value CNT is one or three. In addition, if the control value CV loaded into the decision unit 820 is "11" corresponding to the frequency setting of 13 MHz, the decision unit 820 sets the output signal CLK_EN to logic 1 when the received count value CNT is zero, and sets output signal CLK_EN to logic 0 when the received count value CNT is one, two, or three. If the control value CV loaded into the decision unit 820 is "01" corresponding to the frequency setting of 39 MHz, the decision unit 820 can set the output signal CLK_EN to logic 1 when the received count value CNT is zero, one, or two, and sets the output signal CLK_EN to logic 0 when the received count value CNT is three.

Then, the clock-gating unit 830 generates the system clock signal SCLK according to the output signal CLK_EN and the reference clock signal RCLK. In this embodiment, the clock-gating unit 830 is an AND gate for performing a logical AND operation on the reference clock signal RCLK and the output signal CLK_EN to generate the system clock signal SCLK. As is well known in the related art, the clock-gating unit 830 also functions to balance the clock tree. In practice, the clock-gating unit 830 may be realized by using an OR gate. In such a design choice, the output signal CLK_EN needs to be inverted before it is applied to the clock-gating unit.

As mentioned previously, the frequency of the frequency-divided signal FD_1 output from the counter 810 is fixed at 13 MHz. Accordingly, when the frequency divider 800 switches the frequency of the system clock signal SCLK from 52 MHz to 26 MHZ at the time point 902, the counting period of the counter, used for generating the enable signal ES, in the enable signal generator 730 does not change. Therefore, the period of the enable signal ES does not change either. Additionally, since the time point that the system clock signal SCLK being switched, i.e., the time point 902, corresponds to a pulse edge of the frequency-divided signal FD_1, the enable signal ES generated based on the frequency-divided signal FD_1 is edge-aligned to the frequency-changed system clock SCLK. In other words, the enable signal ES does not drift while switching the frequency of the system clock signal SCLK. Similarly, other enable signals generated by the enable signal generator 730 do not drift while switching the frequency of the system clock signal SCLK either.

Figure 10:
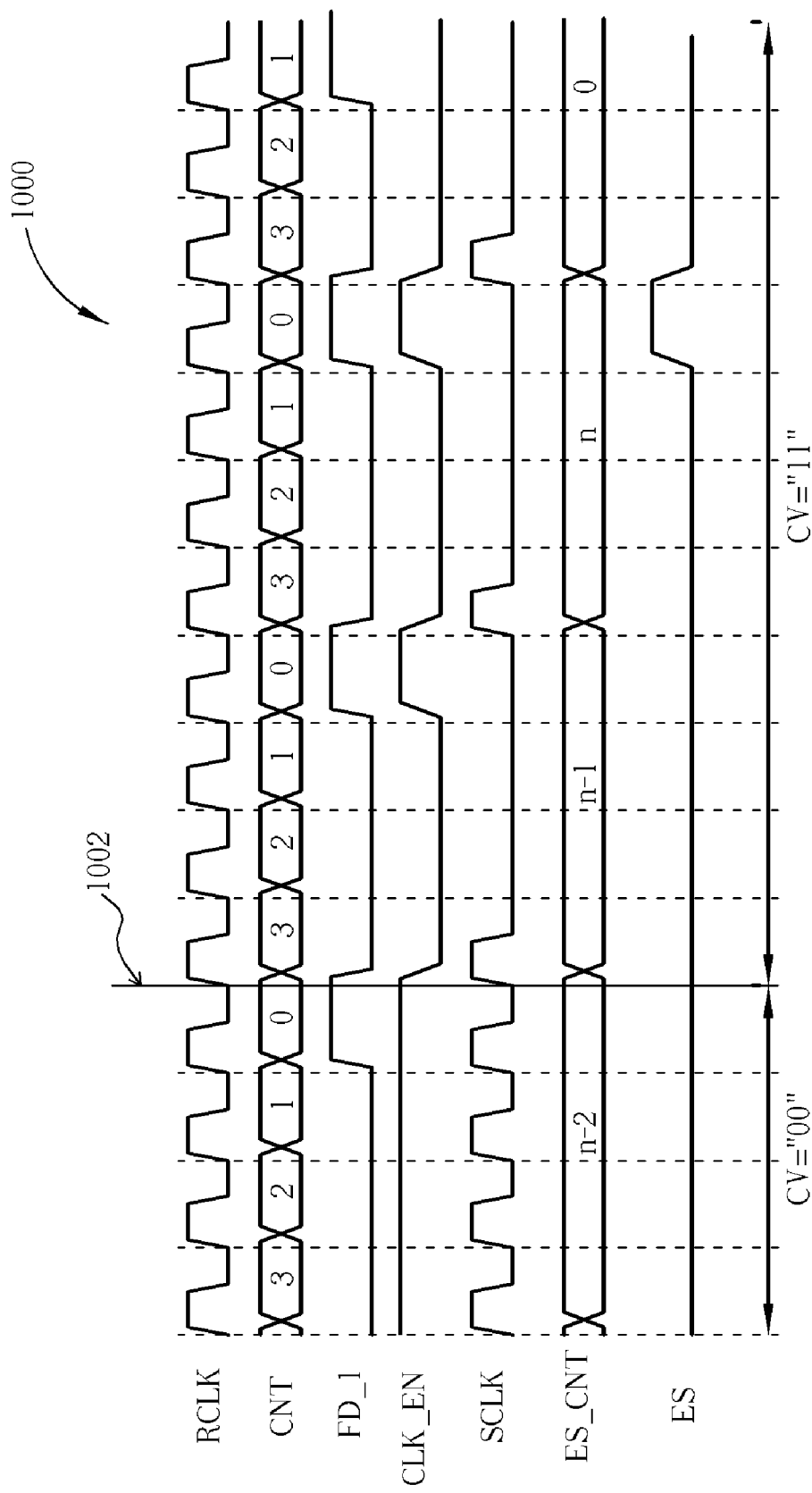
Figure 11:
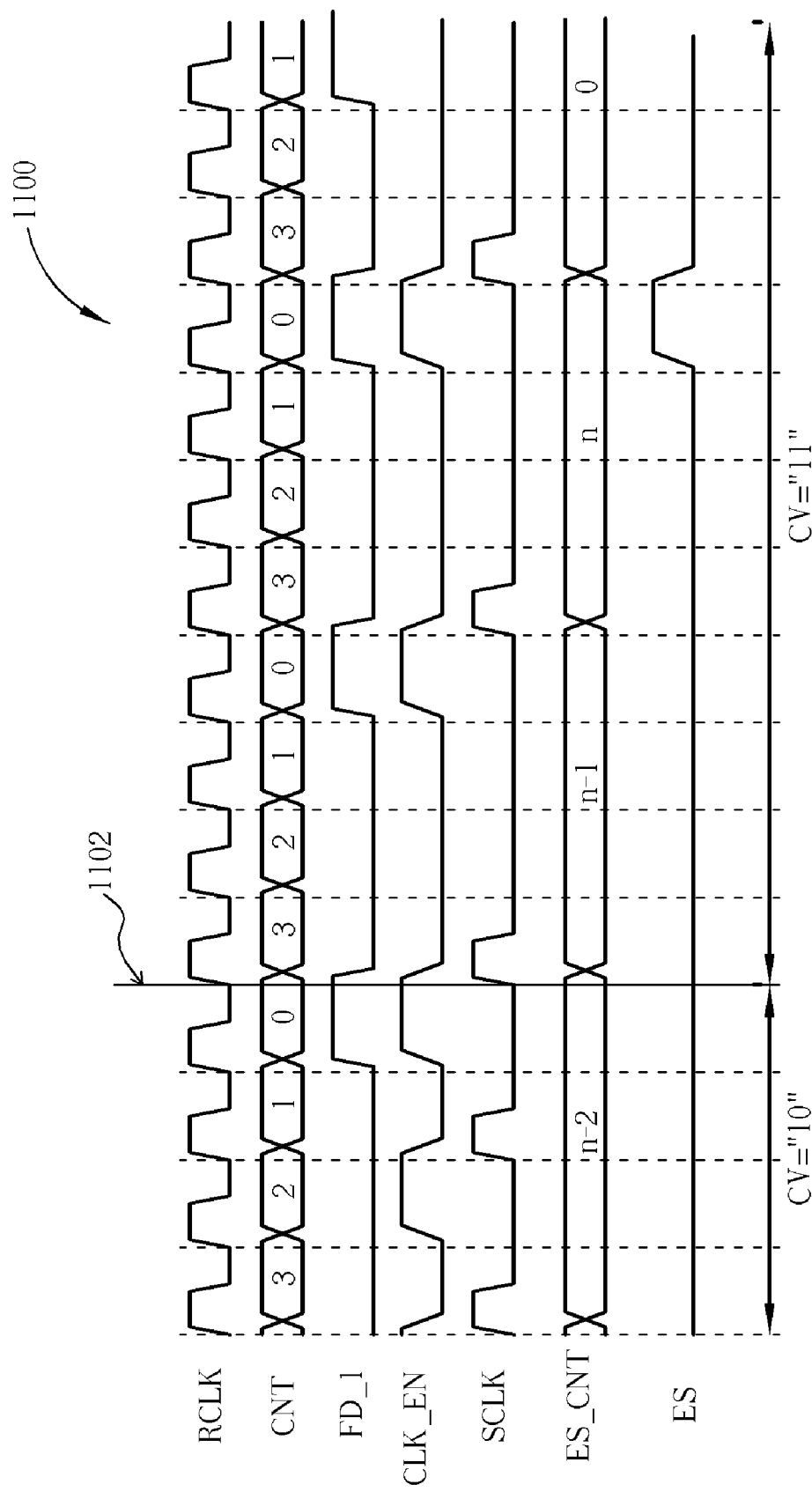
Figure 12:
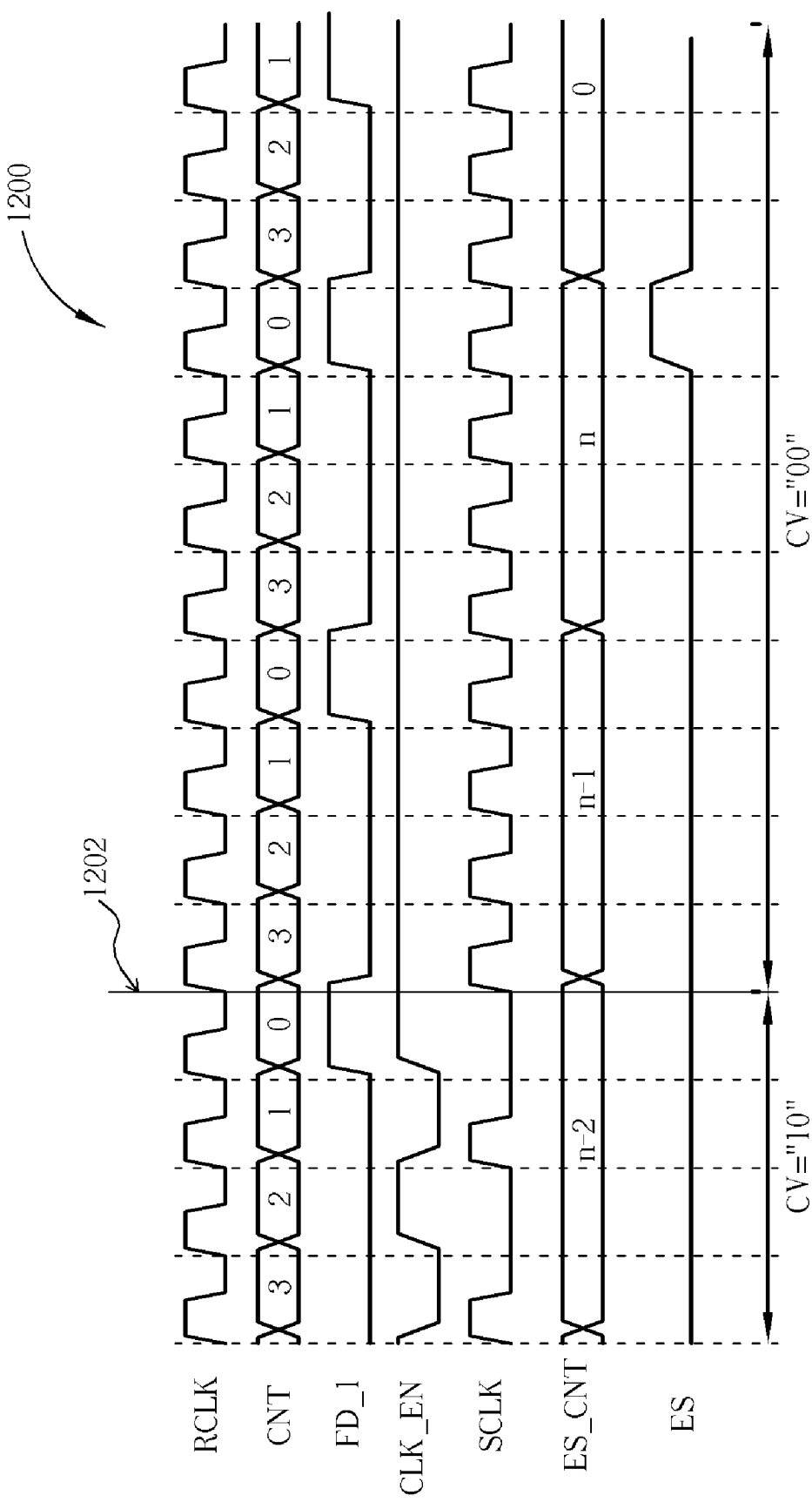

Please refer to FIG. 10 through FIG. 12. FIG. 10 is a timing diagram 1000 of the frequency divider 800 that illustrates frequency switch of the system clock signal SCLK from 52 MHz to 13 MHz. FIG. 11 is a timing diagram 1100 of the frequency divider 800 that illustrates frequency switch of the system clock signal SCLK from 26 MHz to 13 MHz. FIG. 12 is a timing diagram 1200 of the frequency divider 800 that illustrates frequency switch of the system clock signal SCLK from 26 MHz to 52 MHz. In the timing diagram 1000 shown in FIG. 10, the original control value CV loaded into the decision unit 820 is "00" corresponding to the frequency setting of 52 MHz. At a time point 1002 in which the count value CNT is zero, a new control value "11" corresponding to the frequency setting of 13 MHz is loaded into the decision unit 820. As shown in the timing diagram 1000, after the frequency divider 800 switches the frequency of the system clock signal SCLK from 52 MHz to 13 MHz at the time point 1002, the enable signal ES generated by the enable signal generator 730 does not drift. In the timing diagram 1100, after the frequency divider 800 switches the frequency of the system clock signal SCLK from 26 MHz to 13 MHz at a time point 1102, the enable signal ES generated by the enable signal generator 730 does not drift. Similarly, as shown in the timing diagram 1200, the enable signal ES generated by the enable signal generator 730 does not drift after the frequency divider 800 switches the frequency of the system clock signal SCLK from 26 MHz to 52 MHz at the time point 1202.

As can be derived from the foregoing descriptions, the operations of the counter 810 are independent of the control value CV loaded into the decision unit 820 so that the frequency of the frequency-divided signal FD_1 is fixed in one-fourth of the frequency of the reference clock signal RCLK, i.e., 13 MHz. Accordingly, the count value ES_CNT generated by counting based on the frequency-divided signal FD_1 by the counter of the enable signal generator 730 is also independent of the control value CV. In other words, the enable signal ES generated from the enable signal generator 730 does not drift while the frequency divider 800 is switching the frequency of the system clock signal SCLK according to the control value CV.

Figure 13:
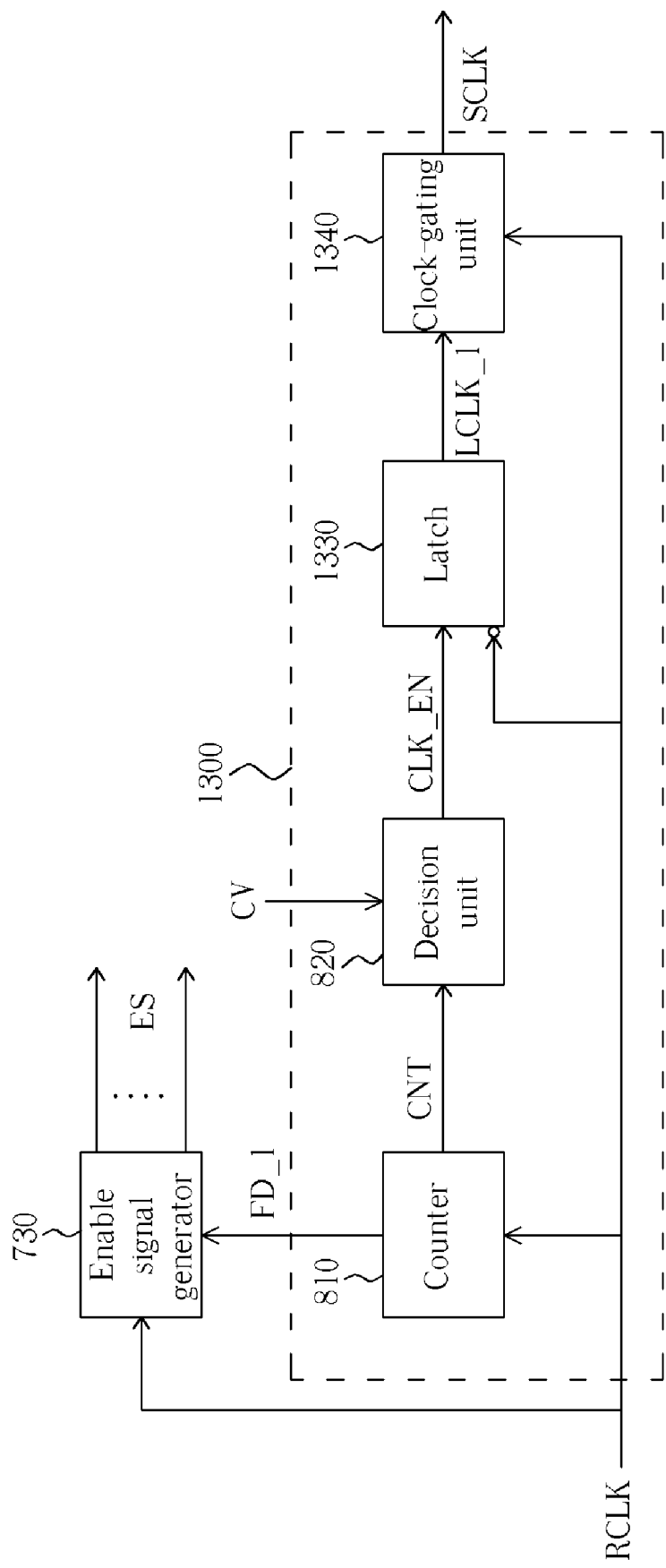
FIG. 13 is a block diagram of the frequency divider of FIG. 7 according to a second embodiment.

FIG. 13 shows a block diagram of a frequency divider 1300 being a second embodiment of the frequency divider 720. As shown, the frequency divider 1300 comprises a counter 810, a decision unit 820, and a clock-gating unit 1340. The counter 810 and the decision unit 820 are similar to the aforementioned embodiments and repeated descriptions are therefore omitted for brevity. A difference between the frequency divider 800 and the frequency divider 1300 is that the frequency divider 1300 further comprises a latch 1330 coupled between the decision unit 820 and the clock-gating unit 1340. The latch 1330 is arranged for latching the output signal CLK_EN to generate a delayed clock signal LCLK_1 according to the reference clock signal RCLK. In this embodiment, the clock-gating unit 1340 generates the system clock signal SCLK according to the delayed clock signal LCLK_1 and the reference clock signal RCLK. By utilizing the latch 1330, the frequency divider 1300 can further reduce glitch in the system clock signal SCLK and improve the signal quality of the system clock signal SCLK. The clock-gating unit 1340 may be implemented by an AND gate or an OR gate.

Figure 14:
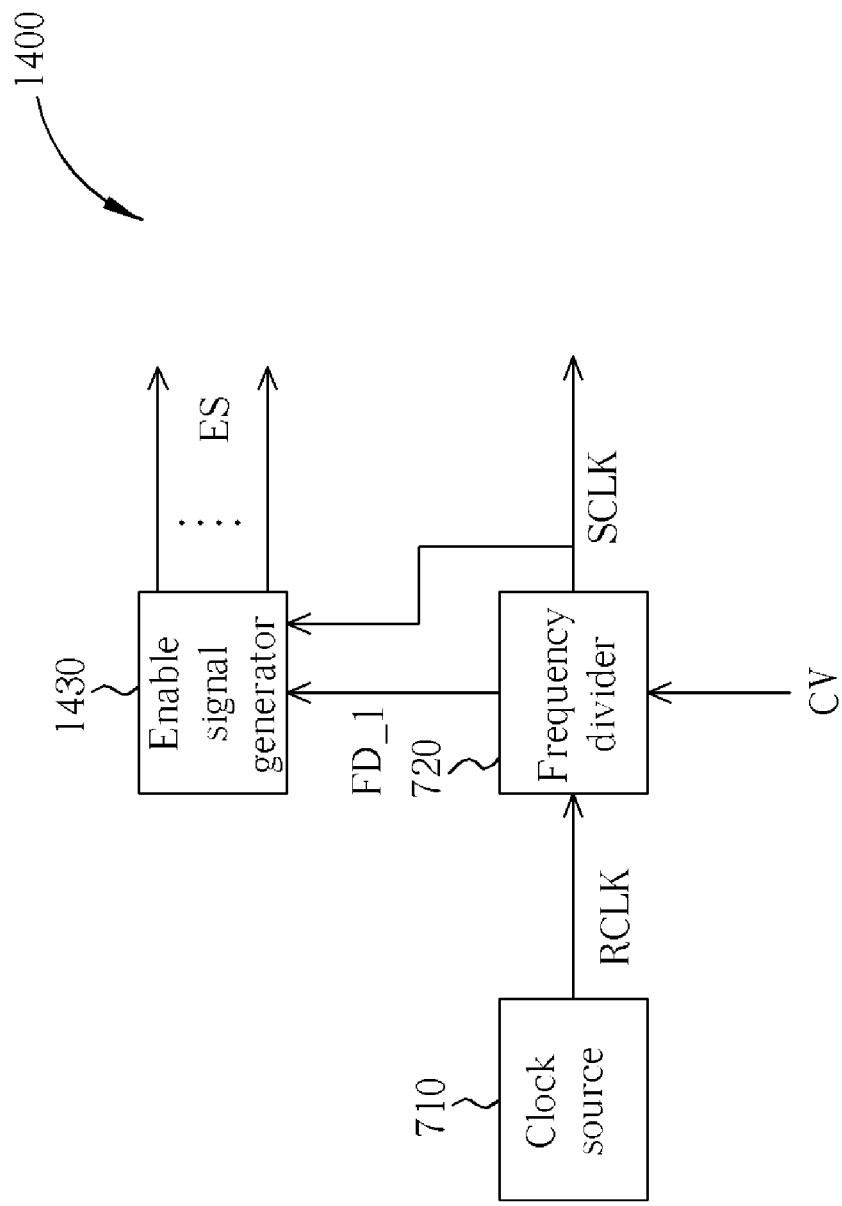
FIG. 14 is a block diagram of a system clock switching apparatus according to a third embodiment.

In the foregoing embodiments, the reference clock signal RCLK is employed to be the working clock of the enable signal generator 730. This is merely an example rather than a restriction of the practical implementations. For example, FIG. 14 shows a block diagram of a system clock switching apparatus 1400 according to a third embodiment. The system clock switching apparatus 1400 includes a clock source 710, a frequency divider 720, and an enable signal generator 1430. The operations and implementations of the clock source 710 and the frequency divider 720 are substantially the same as the foregoing embodiments. Differing from the foregoing embodiments, the system clock signal SCLK generated from the frequency divider 720 is employed to be the working clock of the enable signal generator 1430 in the system clock switching apparatus 1400. In practice, any other clock signal generated by frequency-dividing the reference clock signal RCLK or the system clock signal SCLK can also be employed to be the working clock of the enable signal generator 1430. Similarly, the enable signal generator 1430 can be realized with one or more counters.

Figure 15:
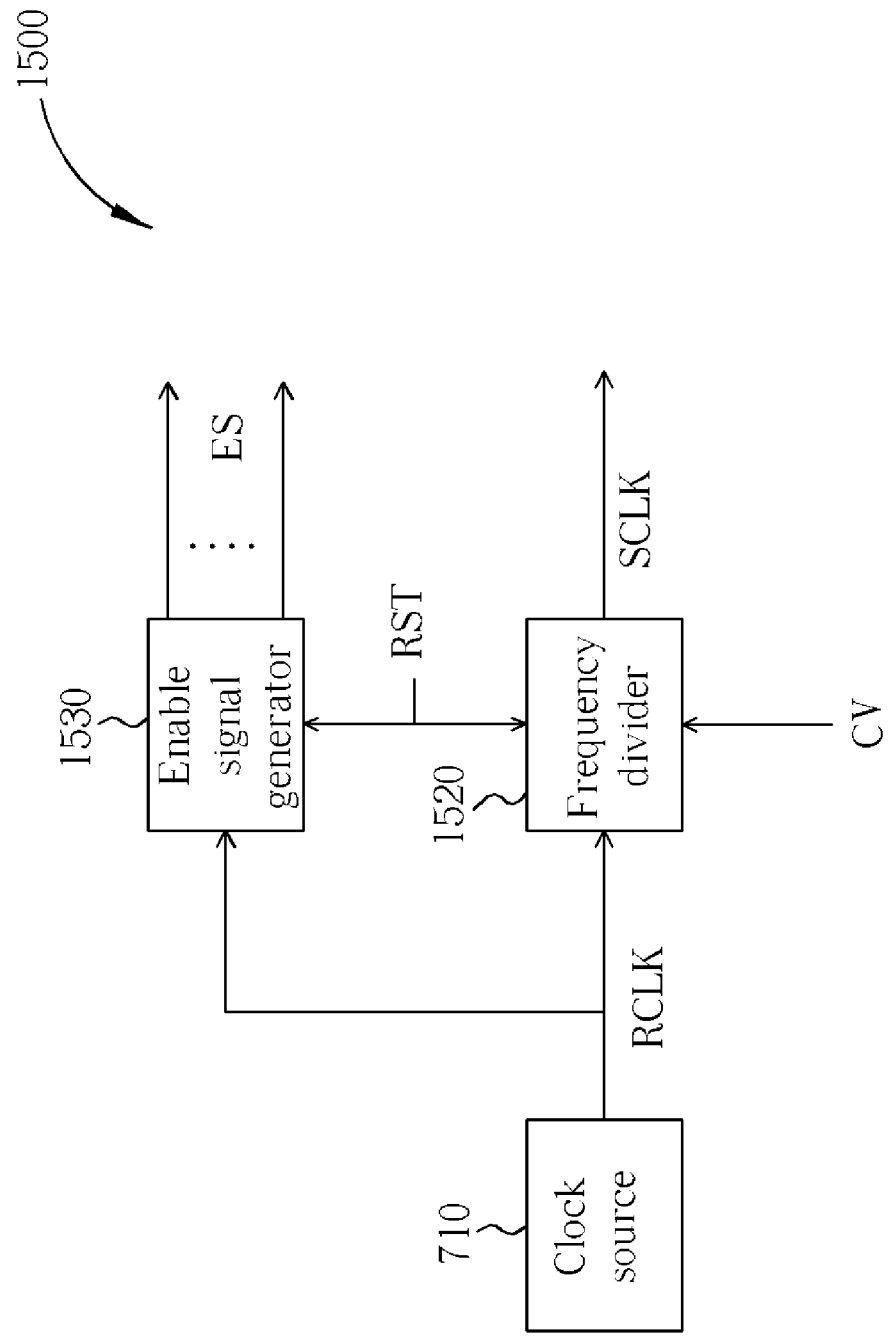
FIG. 15 is a block diagram of a system clock switching apparatus according to a four embodiment.

FIG. 15 shows a block diagram of a system clock switching apparatus 1500 according to a fourth embodiment. The system clock switching apparatus 1500 comprises a clock source 710, a frequency divider 1520 coupled to the clock source 710, and an enable signal generator 1530. In this embodiment, the enable signal generator 1530 is arranged for dividing the reference clock signal RCLK provided by the clock source 710 to generate at least one enable signal ES. The frequency divider 1520 divides the reference clock signal RCLK to generate a system clock signal SCLK according to a control value CV. In operations, the system clock switching apparatus 1500 utilizes a reset signal RST to synchronously reset the enable signal generator 1530 and the frequency divider 1520 so that both the enable signal generator 1530 and the frequency divider 1520 synchronously begin the frequency-dividing operations on the reference clock signal RCLK. In this way, each of the enable signals generated from the enable signal generator 1530 is edge-aligned to the system clock signal SCLK generated from the frequency divider 1520.

In addition, if the enable signal generator 1530 is designed to generate a single enable signal ES, the frequency divider 1520 loads the control value CV for determining whether to adjust the frequency of the system clock signal SCLK during a time period corresponding to a pulse edge of the enable signal ES. In this embodiment, if the currently loaded control value CV differs from the previously loaded control value CV, the frequency divider 1520 adjusts the frequency of the system clock signal SCLK based on the currently loaded control value CV. If the currently loaded control value CV is the same as the previously loaded control value CV, or there is no new control value CV being loaded at the time, the decision unit 820 continues its operations based on the previously loaded control value CV. If the enable signal generator 1530 is designed to generate a plurality of enable signals, the frequency divider 1520 loads the control value CV during a time period corresponding to a common edge of the plurality of enable signals. In other words, the operating mode of the frequency divider 1520 can only be switched or changed during the common edge of the plurality of enable signals. As a result, the enable signals do not drift while the frequency divider 1520 is switching the frequency of the system clock signal SCLK. In view of this aspect, the frequency divider 1520 and the enable signal generator 1530 synchronously perform independent frequency-dividing operations on the reference clock signal RCLK.

Figure 16:
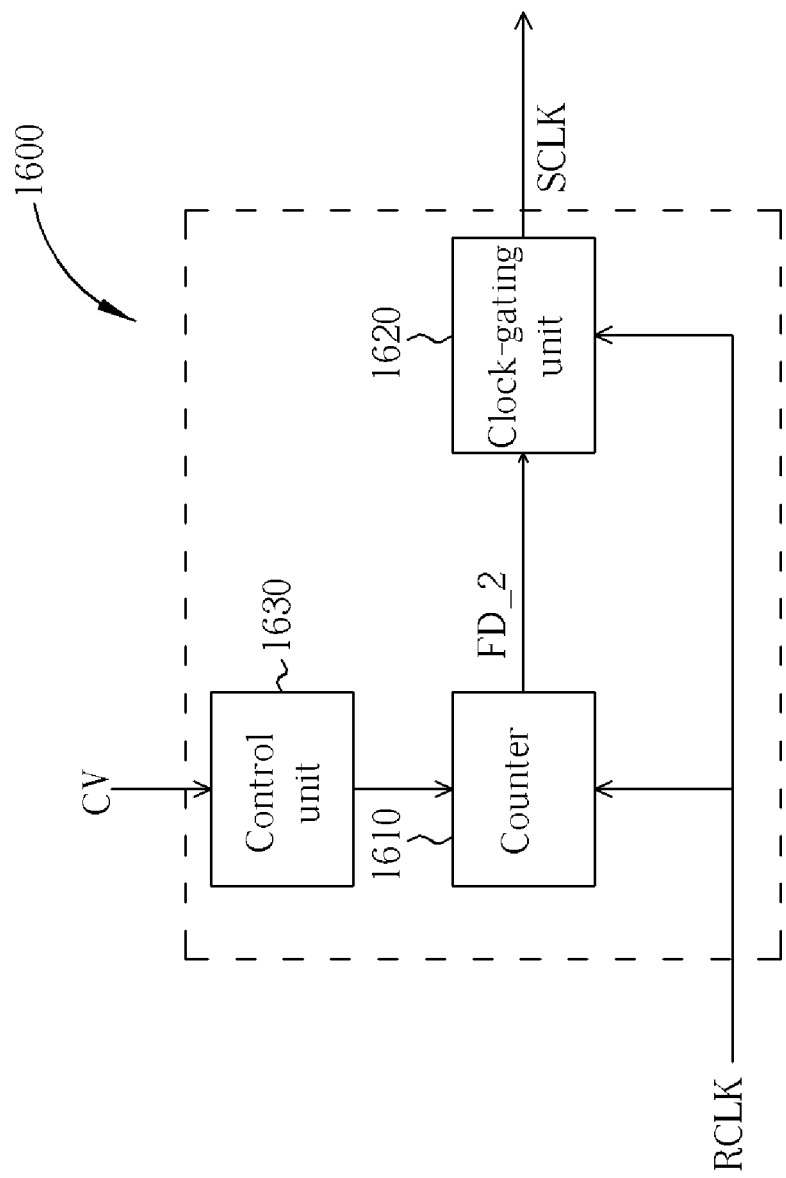
FIG. 16 and FIG. 17 are block diagrams of different embodiments of the frequency divider of FIG. 15.
Figure 17:
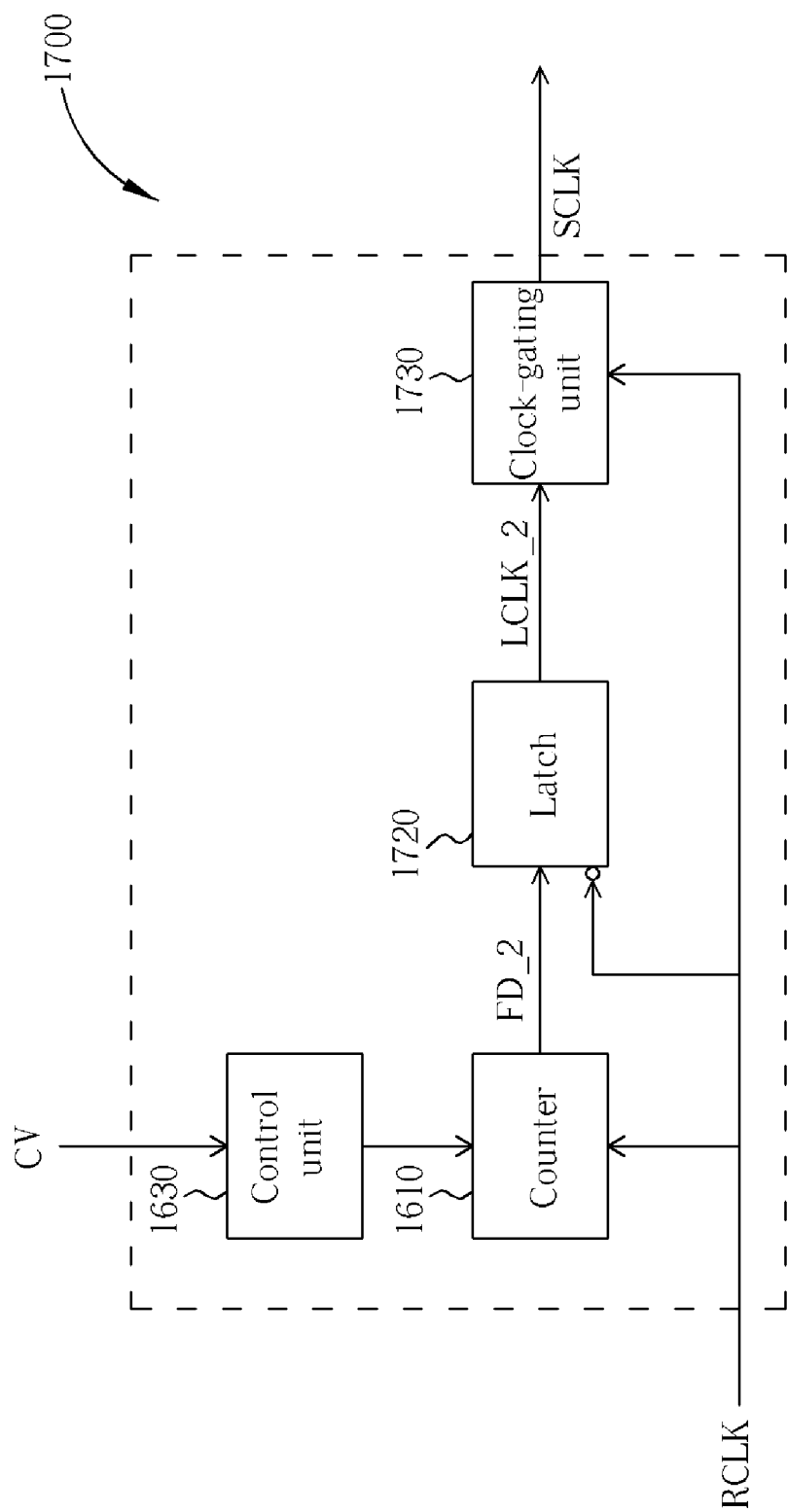

Please refer to FIG. 16 and FIG. 17. FIG. 16 shows a block diagram of a frequency divider 1600 being a first embodiment of the frequency divider 1520. The frequency divider 1600 comprises a counter 1610 coupled to the clock source 710 for generating a frequency-divided signal FD_2 according to the reference clock signal RCLK and the control value CV; a clock-gating unit 1620 coupled to the counter 1610 and the clock source 710 for generating a system clock signal SCLK according to the frequency-divided signal FD_2 and the reference clock signal RCLK;

and a control unit 1630 for determining the timing for loading the control value CV into the counter 1610. FIG. 17 shows a block diagram of a frequency divider 1700 being a second embodiment of the frequency divider 1520. Similarly, the counter 1610 of the frequency divider 1700 receives the control value CV through the control unit 1630 and generates the frequency-divided signal FD_2 according to the control value CV. In addition, a latch 1720 is coupled to the counter 1610 for latching the frequency-divided signal FD_2 to produce a delayed clock signal LCLK_2 according to the reference clock signal RCLK. Then, a clock-gating unit 1730 is utilized for generating the system clock signal SCLK according to the delayed clock signal LCLK_2 and the reference clock signal RCLK. Both the frequency dividers 1600 and 1700 update the control value CV applied to the counter 1610 to change the frequency of the frequency-divided signal FD_2 during a time period corresponding to a common edge of the enable signals generated from the enable signal generator 1530. Similarly, each clock-gating unit 1620 and the clock-gating unit 1730 can be realized with an AND gate or an OR gate.

Note that each of the counters mentioned previously may be configured as an up-counting counter or a down-counting counter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system clock switching apparatus comprising:
   a clock source for providing a reference clock signal;
   a frequency divider electrically connected to the clock source for dividing the reference clock signal to produce a frequency-divided signal and a system clock signal; and
   an enable signal generator electrically connected to the frequency divider for dividing the frequency-divided signal to produce at least one enable signal;
   wherein the frequency divider switches a frequency of the system clock signal during a time period corresponding to a pulse edge of the frequency-divided signal.

2. The system clock switching apparatus of claim 1, wherein the clock source is a phase-locked loop (PLL).

3. The system clock switching apparatus of claim 1, wherein one of the reference clock signal and the system clock signal is employed as a working clock signal for the enable signal generator.

4. The system clock switching apparatus of claim 1, wherein the enable signal generator comprises at least one counter.

5. The system clock switching apparatus of claim 1, wherein the frequency of the reference clock signal is an integer multiple of the frequency of the system clock signal.

6. The system clock switching apparatus of claim 1, wherein the frequency of the reference clock signal is an integer multiple of the frequency of the frequency-divided signal.

7. The system clock switching apparatus of claim 1, wherein the frequency of the system clock signal is an integer multiple of the frequency of the frequency-divided signal.

8. The system clock switching apparatus of claim 1, wherein the frequency divider comprises:
   a counter electrically connected to the clock source for generating the frequency-divided signal according to the reference clock signal and for outputting a count value;
   a decision unit electrically connected to the counter for generating an output signal according to a control value and the count value; and
   a clock-gating unit electrically connected to the decision unit and the clock source for generating the system clock signal according to the output signal and the reference clock signal.

9. The system clock switching apparatus of claim 8, wherein the clock-gating unit is an AND gate or an OR gate.

10. The system clock switching apparatus of claim 1, wherein the frequency divider comprises:
    a counter electrically connected to the clock source for generating the frequency-divided signal according to the reference clock signal and for outputting a count value;
    a decision unit electrically connected to the counter for generating an output signal according to a control value and the count value;
    a latch electrically connected to the decision unit for latching the output signal to generate a delayed clock signal according to the reference clock signal; and
    a clock-gating unit electrically connected to the latch and the clock source for generating the system clock signal according to the delayed clock signal and the reference clock signal.

11. The system clock switching apparatus of claim 10, wherein the clock-gating unit is an AND gate or an OR gate.

12. A system clock switching apparatus comprising:
    a clock source for providing a reference clock signal;
    an enable signal generator electrically connected to the clock source for generating at least one enable signal; and
    a frequency divider electrically connected to the clock source for dividing the reference clock signal to generate a system clock signal, and for switching the frequency of the system clock signal from one non-zero value into another non-zero value during a time period corresponding to a pulse edge of the enable signal.

13. The system clock switching apparatus of claim 12, wherein the clock source is a phase-locked loop (PLL).

14. The system clock switching apparatus of claim 12, wherein the enable signal generator generates a plurality of enable signals with different frequencies and the frequency divider switches the frequency of the system clock signal during a time period corresponding to a common edge of the plurality of enable signals.

15. The system clock switching apparatus of claim 12, wherein the frequency of the reference clock signal is an integer multiple of the frequency of the system clock signal.

16. The system clock switching apparatus of claim 12, wherein the frequency of the reference clock signal is an integer multiple of the frequency of the enable signal.

17. The system clock switching apparatus of claim 12, wherein the frequency of the system clock signal is an integer multiple of the frequency of the enable signal.

18. The system clock switching apparatus of claim 12, wherein the frequency divider comprises:
    a counter electrically connected to the clock source for generating a frequency-divided signal according to the reference clock signal and a control value;
    a control unit electrically connected to the counter for controlling the timing of loading the control value into the counter; and a clock-gating unit electrically connected to the counter and the clock source for generating the system clock signal according to the frequency-divided signal and the reference clock signal.

19. The system clock switching apparatus of claim 18, wherein the clock-gating unit is an AND gate or an OR gate.

20. The system clock switching apparatus of claim 12, wherein the frequency divider comprises:
a counter electrically connected to the clock source for generating a frequency-divided signal according to the reference clock signal and a control value;
a control unit electrically connected to the counter for controlling the timing of loading the control value into the counter;
a latch electrically connected to the counter for latching the frequency-divided signal to produce a delayed clock signal; and
a clock-gating unit electrically connected to the latch and the clock source for generating the system clock signal according to the delayed clock signal and the reference clock signal.

21. The system clock switching apparatus of claim 20, wherein the clock-gating unit is an AND gate or an OR gate.

22. The system clock switching apparatus of claim 12, wherein the enable signal generator and the frequency divider are synchronously reset according to a reset signal.

23. The system clock switching apparatus of claim 12, further comprising:
a switching counter for counting the system clock signal to generate a count value;
a switching signal generator electrically connected to the switching counter for generating a switching signal when the count value reaches a predetermined value; and
a control unit electrically connected to the switching signal generator and the frequency divider for controlling the frequency divider to switch frequency of the system clock signal when the switching signal has occurred;
wherein the predetermined value corresponds to a time period corresponding to a pulse edge of the enable signal.

24. The system clock switching apparatus of claim 12, wherein the enable signal generator divides the system clock signal or the reference clock signal to generate the enable signal.

25. A method for switching a frequency of a system clock signal comprising:
(a) providing a reference clock signal;
(b) dividing the reference clock signal to produce a frequency-divided signal;
(c) generating a system clock signal according to the reference clock signal;
(d) dividing the frequency-divided signal to produce at least one enable signal; and
(e) switching frequency of the system clock signal during a time period corresponding to a pulse edge of the frequency-divided signal.

26. The method of claim 25, wherein step (d) comprises dividing the frequency-divided signal to generate a plurality of enable signals with different frequencies and step (e) comprises adjusting the frequency of the system clock signal during a time period corresponding to a common pulse edge of the plurality of enable signals.

27. The method of claim 25, wherein the frequency of the reference clock signal is an integer multiple of the frequency of the system clock signal.

28. The method of claim 25, wherein the frequency of the reference clock signal is an integer multiple of the frequency of the frequency-divided signal.

29. The method of claim 25, wherein the frequency of the system clock signal is an integer multiple of the frequency of the frequency-divided signal.

30. The method of claim 25, wherein step (c) further comprises:
generating a count value according to the reference clock signal;
generating an output signal according to a control value and the count value; and
clock-gating the output signal to produce the system clock signal according to the reference clock signal.

31. The method of claim 30, wherein the step of clock-gating the output signal comprises:
performing an AND operation or an OR operation on the reference clock signal and the output signal.

32. The method of claim 25, wherein step (c) further comprises:
generating a count value according to the reference clock signal;
generating an output signal according to a control value and the count value;
latching the output signal to produce a delayed clock signal according to the reference clock signal; and
clock-gating the delayed clock signal to generate the system clock signal according to the reference clock signal.

33. The method of claim 32, wherein the step of clock-gating the output signal comprises:
performing an AND operation or an OR operation on the reference clock signal and the output signal.

34. A method for switching a frequency of a system clock signal comprising:
(a) providing a reference clock signal;
(b) generating at least one enable signal;
(c) dividing the reference clock signal to produce a system clock signal; and
(d) switching frequency of the system clock signal from one non-zero value into another non-zero value during a time period corresponding to a pulse edge of the enable signal.

35. The method of claim 34, wherein step (b) comprises dividing the reference clock signal to generate a plurality of enable signals with different frequencies, and step (d) comprises adjusting the frequency of the system clock signal during a time period corresponding to a common pulse edge of the plurality of enable signals.

36. The method of claim 34, wherein the frequency of the reference clock signal is an integer multiple of the frequency of the system clock signal.

37. The method of claim 34, wherein the frequency of the reference clock signal is an integer multiple of the frequency of the enable signal.

38. The method of claim 34, wherein the frequency of the system clock signal is an integer multiple of the frequency of the enable signal.

39. The method of claim 34, wherein step (c) comprises:
generating a frequency-divided signal according to the reference clock signal and a control value;
clock-gating the frequency-divided signal to produce the system clock signal according to the reference clock signal.

40. The method of claim 39, wherein the step of clock-gating the output signal comprises:

performing an AND operation or an OR operation on the reference clock signal and the output signal.

41. The method of claim 34, wherein step (c) comprises:
generating a frequency-divided signal according to the reference clock signal and a control value;
latching the frequency-divided signal to produce a delayed clock signal according to the reference clock signal; and
clock-gating the delayed clock signal to generate the system clock signal according to the reference clock signal.

42. The method of claim 41, wherein the step of clock-gating the output signal comprises:
performing an AND operation or an OR operation on the reference clock signal and the output signal.

43. The method of claim 34, wherein steps (b) and (c) begin synchronously.

44. The method of claim 34, wherein step (b) further comprises:
dividing the system clock signal or the reference clock signal to produce the enable signal.

45. The method of claim 34, wherein step (d) further comprises:
counting the system clock signal to generate a count value; and
switching the frequency of the system clock signal when the count value reaches a predetermined value;
wherein the predetermined value corresponds to a time period corresponding to a pulse edge of the enable signal.

46. A system clock switching apparatus comprising:
a clock source for providing a reference clock signal;
an enable signal generator electrically connected to the clock source for generating a plurality of enable signals with different frequencies; and
a frequency divider electrically connected to the clock source for dividing the reference clock signal to generate a system clock signal, and for switching the frequency of the system clock signal during a time period corresponding to a common edge of the plurality of enable signals.

47. A system clock switching apparatus comprising:
a clock source for providing a reference clock signal;
an enable signal generator electrically connected to the clock source for generating at least one enable signal; and
a frequency divider electrically connected to the clock source for dividing the reference clock signal to generate a system clock signal, and for switching the frequency of the system clock signal during a time period corresponding to a pulse edge of the enable signal, wherein the frequency of the system clock signal is an integer multiple of the frequency of the enable signal.

48. A system clock switching apparatus comprising:
a clock source for providing a reference clock signal;
an enable signal generator electrically connected to the clock source for generating at least one enable signal; and
a frequency divider electrically connected to the clock source for dividing the reference clock signal to generate a system clock signal, and for switching the frequency of the system clock signal during a time period corresponding to a pulse edge of the enable signal, wherein the frequency divider comprises:
a counter electrically connected to the clock source for generating a frequency-divided signal according to the reference clock signal and a control value;
a control unit electrically connected to the counter for controlling the timing of loading the control value into the counter; and
a clock-gating unit electrically connected to the counter and the clock source for generating the system clock signal according to the frequency-divided signal and the reference clock signal.

49. A system clock switching apparatus comprising:
a clock source for providing a reference clock signal;
an enable signal generator electrically connected to the clock source for generating at least one enable signal; and
a frequency divider electrically connected to the clock source for dividing the reference clock signal to generate a system clock signal, and for switching the frequency of the system clock signal during a time period corresponding to a pulse edge of the enable signal, wherein the frequency divider comprises:
a counter electrically connected to the clock source for generating a frequency-divided signal according to the reference clock signal and a control value;
a control unit electrically connected to the counter for controlling the timing of loading the control value into the counter;
a latch electrically connected to the counter for latching the frequency-divided signal to produce a delayed clock signal; and
a clock-gating unit electrically connected to the latch and the clock source for generating the system clock signal according to the delayed clock signal and the reference clock signal.

50. A system clock switching apparatus comprising:
a clock source for providing a reference clock signal;
an enable signal generator electrically connected to the clock source for generating at least one enable signal;
a frequency divider electrically connected to the clock source for dividing the reference clock signal to generate a system clock signal, and for switching the frequency of the system clock signal during a time period corresponding to a pulse edge of the enable signal;
a switching counter for counting the system clock signal to generate a count value;
a switching signal generator electrically connected to the switching counter for generating a switching signal when the count value reaches a predetermined value; and
a control unit electrically connected to the switching signal generator and the frequency divider for controlling the frequency divider to switch frequency of the system clock signal when the switching signal has occurred;
wherein the predetermined value corresponds to a time period corresponding to a pulse edge of the enable signal.

51. A system clock switching apparatus comprising:
a clock source for providing a reference clock signal;
an enable signal generator electrically connected to the clock source for dividing a system clock signal to generate at least one enable signal; and
a frequency divider electrically connected to the clock source for dividing the reference clock signal to generate the system clock signal, and for switching the frequency of the system clock signal during a time period corresponding to a pulse edge of the enable signal.

52. A method for switching a frequency of a system clock signal comprising:
    (a) providing a reference clock signal;
    (b) dividing the reference clock signal to generate a plurality of enable signals with different frequencies;
    (c) dividing the reference clock signal to produce a system clock signal; and
    (d) switching frequency of the system clock signal during a time period corresponding to a common pulse edge of the plurality of enable signals.

53. A method for switching a frequency of a system clock signal comprising:
    (a) providing a reference clock signal;
    (b) generating at least one enable signal;
    (c) dividing the reference clock signal to produce a system clock signal; and
    (d) switching frequency of the system clock signal during a time period corresponding to a pulse edge of the enable signal;
    wherein the frequency of the system clock signal is an integer multiple of the frequency of the enable signal.

54. A method for switching a frequency of a system clock signal comprising:
    (a) providing a reference clock signal;
    (b) generating at least one enable signal;
    (c) generating a frequency-divided signal according to the reference clock signal and a control value, and clock-gating the frequency-divided signal to produce a system clock signal according to the reference clock signal; and
    (d) switching frequency of the system clock signal during a time period corresponding to a pulse edge of the enable signal.

55. A method for switching a frequency of a system clock signal comprising:
    (a) providing a reference clock signal;
    (b) generating at least one enable signal;
    (c) generating a frequency-divided signal according to the reference clock signal and a control value, latching the frequency-divided signal to produce a delayed clock signal according to the reference clock signal, and clock-gating the delayed clock signal to generate a system clock signal according to the reference clock signal; and
    (d) switching frequency of the system clock signal during a time period corresponding to a pulse edge of the enable signal.

56. A method for switching a frequency of a system clock signal comprising:
    (a) providing a reference clock signal;
    (b) dividing a system clock signal to produce at least one enable signal;
    (c) dividing the reference clock signal to produce the system clock signal; and
    (d) switching frequency of the system clock signal during a time period corresponding to a pulse edge of the enable signal.

57. A method for switching a frequency of a system clock signal comprising:
    (a) providing a reference clock signal;
    (b) generating at least one enable signal;
    (c) dividing the reference clock signal to produce a system clock signal; and
    (d) counting the system clock signal to generate a count value, and switching the frequency of the system clock signal when the count value reaches a predetermined value, wherein the predetermined value corresponds to a time period corresponding to a pulse edge of the enable signal.

* * * * *